United States Patent [19]
Ogi et al.

[11] Patent Number: 5,630,872
[45] Date of Patent: May 20, 1997

[54] FORMATION OF THIN-FILM PATTERNS OF A METAL OXIDE

[75] Inventors: Katsumi Ogi; Tadashi Yonezawa; Nobuyuki Soyama; Kensuke Kageyama, all of Omiya, Japan

[73] Assignee: Mitsubishi Materials Corporation, Tokyo, Japan

[21] Appl. No.: 570,576

[22] Filed: Dec. 11, 1995

[30] Foreign Application Priority Data

| Dec. 9, 1994 | [JP] | Japan | 6-306204 |
| Dec. 20, 1994 | [JP] | Japan | 6-316467 |
| Jan. 24, 1995 | [JP] | Japan | 7-008870 |
| Feb. 15, 1995 | [JP] | Japan | 7-026696 |

[51] Int. Cl.$^6$ .................................................. C23C 18/14
[52] U.S. Cl. ................................ 106/287.18; 106/287.19; 106/287.25
[58] Field of Search .................. 106/287.18, 287.19, 106/287.25

[56] References Cited

PUBLICATIONS

Soyama et al, CA 124:217495 "The formation of fine–patterned . . . " 1996.
Soyama et al, CA 124:133339 "Composition for formation . . . " Oct. 17, 1995.
Sasaki et al, CA 124:41509 "Composition for forming metal oxide thin film" Oct. 9, 1995.
Soyama et al, CA 123:304703 "Compositions for patterned . . . " Jul. 25, 1995.

*Primary Examiner*—David Brunsman
*Attorney, Agent, or Firm*—Oblon, Spivak, McClelland, Maier & Neustadt, P.C.

[57] ABSTRACT

A composition for formation of thin-film patterns of a metal oxide which comprises a metal alkoxide and one or more nitro compounds selected from the group consisting of nitrobenzyl alcohol derivatives, nitrobenzaldehyde derivatives, nitrostyrol derivatives, nitroacetophenone derivatives, nitroanisole derivatives and nitrofuran derivatives. This composition is applied to a substrate which is then irradiated with light to perform patterning by utilizing the difference in solubility between the light-irradiated portion and the non-light-irradiated portion, attributed to the photodecomposition reaction of the irradiated portion. A photoreactive compound is added to a starting solution which contains an organic solvent and an organic metal compound, the solution is misted, and the resulting mist is deposited on a substrate while irradiating with light.

22 Claims, 1 Drawing Sheet

5,630,872

FORMATION OF THIN-FILM PATTERNS OF A METAL OXIDE

FIELD OF THE INVENTION

The present invention relates to a composition for forming thin-film patterns of a metal oxide, a process for preparation thereof, a process for formation of thin-film patterns of a metal oxide, a process for preparation of electronic parts and optics, and a process for formation of thin films, based on the sol-gel method involving the use of a metal alkoxide. More particularly, it is concerned with the composition for formation of thin-film patterns of a metal oxide wherein the metal alkoxide has increased photoreactivity, and which allows considerable reduction in the requisite amount of light radiation energy, a process for preparation thereof, a process for formation of thin-film patterns of a metal oxide using the composition, a process for preparation of electronic parts and optics, and a process for formation of thin films which allows formation of thin films with improved step coverage and even film thicknesses on stepped substrates even in cases where it is intended to provide the thin films with relatively large film thicknesses.

DESCRIPTION OF THE RELATED ART

Thin films of metal oxides are used as capacitor films, optical guides, optical elements, etc. in a variety of devices, based on their electric and optical characteristics. For use of a thin film of a metal oxide in a device, it usually becomes necessary to form a thin-film pattern of the metal oxide so as to fabricate a predetermined circuit.

According to the prior art, a thin-film pattern of a metal oxide is formed via formation of the thin film of the metal oxide on a substrate by CVD or sputtering and subsequent wet etching with a resist or dry etching such as RIE (reactive ion etching) for patterning.

A process for formation of thin-film patterns of a metal oxide which utilizes the sol-gel method is also known where a solution which contains an unsubstituted metal alkoxide such as methoxide, ethoxide or isopropoxide or a partially substituted metal alkoxide prepared, if necessary, with addition of an additive for stabilization, etc. thereto is applied to each substrate to form a gel film which is then irradiated with ultraviolet rays for reaction and subsequently subjected to etching for preparation of a pattern. In addition, a modification of the process which involves incorporation of an acid generator is also known (Japanese Unexamined Patent Application Disclosure HEI 5-116454).

Patterning by wet etching or dry etching has the disadvantage of a greater number of steps and increased cost. The addition of an acid generator for increasing the sensitivity, though allowing low-energy processing of films, still has a disadvantage in that an impurity element such as sulfur tends to remain, thus impairing the electrical characteristics.

On the other hand, although the processing by irradiation with ultraviolet rays according to the sol-gel method definitely has the advantage of relatively few steps, it is still disadvantageous in that the amount of light radiation energy must be considerably increased because of the low photoreactivity of the metal alkoxide used in the coating solution. In addition, since the metal compound in the solution has hydrolytic reactivity as well as photoreactivity, a stable pattern cannot be formed in some cases where the solution applied onto a substrate is allowed to stand for a long time, or the work place is in a high-humidity atmosphere.

Hitherto known methods for formation of thin films such as dielectric thin films using liquid starting materials include spin coating, spraying and further LSMCVD (liquid source metallorganic chemical vapor deposition) (U.S. Pat. No. 5,316,579) which involves deposition and accumulation of a mist of a starting solution on a heated substrate, etc.

Of these, spin coating, in cases where it is intended for formation of a thin film on a stepped substrate, results in bridging of gaps between the steps by the starting solution and thus fails to form a thin film conforming to the configuration of the steps and provided with excellent step coverage.

On the other hand, step coverage is expected to be improved somewhat by spraying or LSMCVD; in practice, however, since they are also essentially based on coating with a solution, the starting solution deposited and accumulated on the steps drips over the edges of the steps, and this makes it difficult to form thin films with excellent step coverage which precisely traces the configuration of the substrate.

According to the invention of U.S. Pat. No. 5,316,579, for formation of films by LSMCVD, ultraviolet rays are applied in order to form high-quality films through removal of the solvent left in the films and bonding of molecules in the films. Although the specification of U.S. Pat. No. 5,316,579 makes no reference to step coverage, related publications (Int. Symp. Integrated Ferroelectrics 1991, 1992 and 1994) refer to attainment of satisfactory step coverage for formation of extra-thin films.

However, even according to this method, the step coverage of the resulting thin films is not adequate, and particularly, no step coverage is accomplished for thin films of relatively large film thicknesses.

This is because thicker films are more likely to undergo dripping. More specifically, although it may be expected that immediate evaporation of the mist of the solvent deposited on the substrate by heating the substrate or irradiation thereof with ultraviolet rays in the process of LSMCVD prevents the dripping, in practice solutes precipitated by the evaporation are redissolved in the subsequently deposited mist of the solvent, and repetition of such precipitation and redissolution gradually leads to the phenomenon of dripping. For this reason, LSMCVD of the prior art has not succeeded in forming thin films with excellent step coverage.

OBJECT AND SUMMARY OF THE INVENTION

It is therefore an object of the present invention to overcome the above-mentioned problems of the prior art processes for forming thin-film patterns of a metal oxide, thereby providing a composition for formation of thin-film patterns of a metal oxide which allows efficient formation of thin-film patterns of a metal oxide with excellent characteristics by irradiation with light of low radiation energy, a process for preparation of the composition, a process for formation of thin-film patterns of a metal oxide using the composition, and a process for preparation of electronic parts and optics with such thin-film patterns of a metal oxide.

It is another object of the present invention to overcome the above-mentioned problems of the prior art processes for formation of thin films, thereby providing a process for formation of thin films by LSMCVD which allows easy and efficient formation of thin films with excellent step coverage and even film thicknesses and conforming well to the configurations of substrates even in cases where it is intended to provide the thin films on the stepped substrates with relatively large film thicknesses.

The composition for formation of thin-film patterns of a metal oxide according to the present invention is a composition for formation of thin-film patterns of a metal oxide which contains a metal alkoxide, characterized by comprising one or more nitro compounds selected from the group consisting of nitrobenzyl alcohol derivatives, nitrobenzaldehyde derivatives, nitrostyrol derivatives, nitroacetophenone derivatives, nitroanisole derivatives and nitrofuran derivatives.

Application of the composition for formation of thin-film patterns of a metal oxide according to the present invention to a substrate and subsequent irradiation with light matching a predetermined pattern results in drastic change in solubility of the photoreacted portion upon irradiation with even light of low radiation energy, as compared with the non-irradiated portion (or unreacted portion).

The mechanism of the great change in solubility which is observed for the use of the composition for formation of thin-film patterns of a metal oxide according to the present invention is believed to be as follows, though the details have not yet been elucidated.

That is, of the nitro compounds which may be incorporated in the composition for formation of thin-film patterns of a metal oxide according to the present invention, for example, a nitrobenzyl alcohol derivative readily undergoes alcohol exchange or ligand exchange with the metal alkoxide in the composition according to the equation (1) given below, to produce a highly photoreactive metal compound (A). This metal compound (A), being highly photoreactive, readily undergoes decomposition of the ligand according to the equation (II) given below upon adsorption of even light of low radiation energy, to produce a metal compound $(RO)_3M\text{-}OH$ with a solubility in the solvent which is rather different from that of the starting metal alkoxide $M(OR)_4$. This suggests that even a slight amount of radiation energy can cause the large difference in solubility according to the present invention.

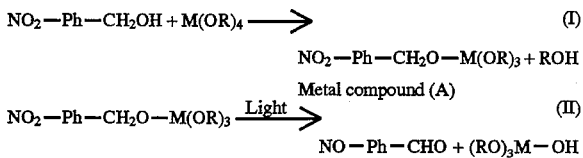

wherein M represents a metal atom, R represents an alkyl group and Ph represents a phenylene group.

Even in cases where the composition for formation of thin-film patterns of a metal oxide contains another nitro compound, it is believed that the other nitro compound provides a metal compound having a greatly different solubility in the solvent from that of the starting metal alkoxide by a reaction similar to the one above.

In the composition for formation of thin-film patterns of a metal oxide according to the present invention, the nitro compound is preferred to be present in an amount of 0.05 to 6 times by mole, and more preferably 0.3 to 2 times by mole relative to the metal alkoxide.

It is also preferred that the composition for formation of thin-film patterns of a metal oxide according to the present invention contain a stabilizer for the metal alkoxide which does not strongly absorb light in the same wavelength range as the irradiated light, thereby improving the humidity resistance and the time stability of the composition to allow formation of stable patterns.

More specifically, since the composition for formation of thin-film patterns of a metal oxide according to the present invention is believed to contain a highly photoreactive compound formed by introducing a photoreactive substituent onto the metal alkoxide as described above, and the remaining functional groups (alkoxy groups) are still highly hydrolyric, the metal compound in the solution has a hydrolytic action in addition to photoreactivity. Therefore, the composition, when allowed to stand on a substrate for a long time after application thereto or in a high-humidity work area, fails to form a stable pattern in some cases; however, addition of a stabilizer against the hydrolysis allows formation of a stable pattern even in cases where the formed coating is allowed to stand in the air or in a high-humidity atmosphere for a long time.

Also, according to the present invention, it is advantageous to preform a complex of the metal alkoxide and the nitro confound by dissolution of the metal alkoxide and the nitro confound in a solvent, followed by heating to reflux.

In other words, it is necessary to increase the amount of production of the above-described highly photoreactive metal confound in order to remarkably decrease the requisite amount of light radiation energy (in order to improve the sensitivity). For this reason, it becomes possible to provide a photosensitive composition for formation of thin-film patterns which has a high photosensitivity and is prepared with a minimum amount of addition of the nitro confound by preformation of the complex of the metal alkoxide and the nitro confound via the reaction of the metal alkoxide and the nitro compound in a solvent under reflux.

The composition for formation of thin-film patterns of a metal oxide according to the present invention is preferred to contain two or more metal alkoxides, in which case the two or more metal alkoxides are desired to be present as a composite alkoxide from a point of view of steady patterning. In addition, it is also effective to remove the organic matter concurrently produced during the formation of the complex in order to prevent the composite alkoxide once formed, from being decomposed into the respective unit alkoxides by a reverse reaction.

The composition for formation of thin-film patterns of a metal oxide according to the present invention is preferred to be prepared through preformation of the complex of the metal alkoxide and the nitro compound by heating to reflux of the metal alkoxide and the nitro compound, followed by addition of a stabilizer or another component thereto.

Also, in cases where two or more metal alkoxides are contained, it is preferred for the two or more metal alkoxides to be heated to reflux in a solvent to form the composite alkoxide in advance, and then a stabilizer and another component added thereto.

Here, it is also preferred to combine the nitro compound to the composite alkoxide as described above. It is effective to remove the organic matter concurrently produced during formation of the complex of the metal oxide or the composite alkoxide and the nitro compound to prevent the complex from being subjected to a reverse reaction.

The process for formation of thin-film patterns of a metal oxide according to the present invention is characterized by applying the composition for formation of thin-film patterns of a metal oxide according to the present invention to each substrate and irradiating the coating film with light according to a predetermined pattern for patterning of the coating film based on the difference in solubility in the solvent between the light-irradiated portion and the non-light-irradiated portion, attributed to the photoreaction of the irradiated portion.

The process for preparation of electronic parts according to the present invention is characterized by preparing electronic parts with thin-film patterns of a metal oxide according to the above-mentioned process.

The process for preparation of optics according to the present invention is characterized by preparing optics with thin-film patterns of a metal oxide according to the above-mentioned process.

The process for formation of thin films according to the present invention is a process for formation of a thin film on each substrate through preparation of a mist of a starting solution containing an organic solvent and the organic metal compound and subsequent deposition of the mist on the heated substrate, characterized in that a photoreactive compound is added to the starting solution, and the mist deposited on each substrate is irradiated with light.

During this process, the solvent in the mist deposited on each substrate is immediately evaporated upon heating of the substrate and the irradiation with light to precipitate solutes; these solutes, however, comprise the highly photoreactive compound originally present in the mist, and therefore all the precipitated solutes become matters insoluble or barely soluble in the mist of the solvent being subsequently deposited thereon.

Accordingly, dripping due to redissolution of the precipitated solutes is prevented and thus a thin film with satisfactory step coverage and conforming well to the configuration of each substrate is formed even in cases where the thin film has a relatively large film thickness.

Such effects of the present invention are accomplished by irradiation of the incorporated photoreactive compound with light, whereas the LSMCVD of U.S. Pat. No. 5,316,579 results in poor step coverage due to redissolution of the solutes once precipitated because no photoreactive compound is contained in the mist and thus the solutes cannot be made insoluble or barely soluble by irradiation with ultraviolet rays.

DETAILED DESCRIPTION

Figure 1:
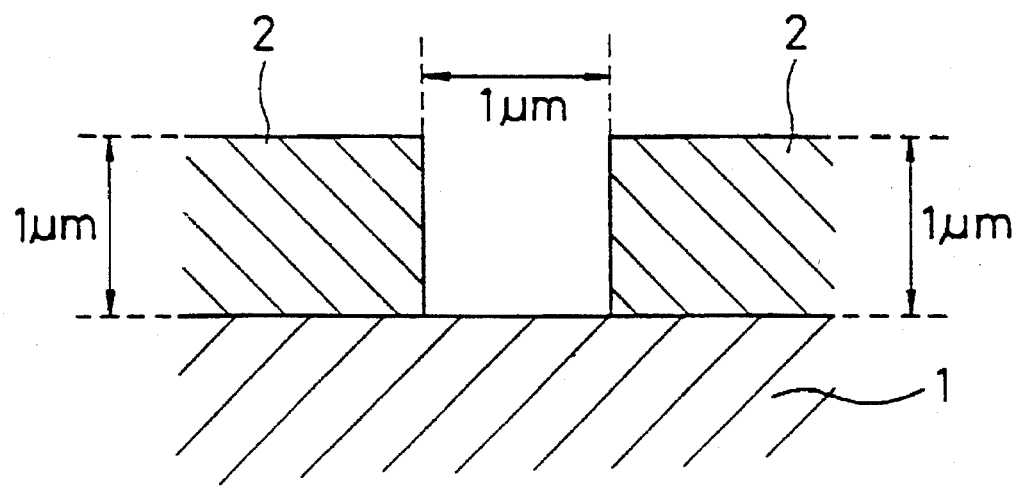
FIG. 1 is a sectional view of the substrate used for formation of thin films of Examples 97–110 and Comparative examples 1–4.

The present invention will now be explained in detail.

First, an explanation will be made regarding the composition for formation of thin-film patterns of a metal oxide, the process for preparation thereof, the process for formation of thin-film patterns of a metal oxide, and the process for preparation of electronic parts and optics, all according to the present invention.

The composition for formation of thin-film patterns of a metal oxide according to the present invention contains one or more nitro con, pounds selected from the group consisting of nitrobenzyl alcohol derivatives, nitrobenzaldehyde derivatives, nitrostyrol derivatives, nitroacetophenone derivatives, nitroanisole derivatives and nitrofuran derivatives.

Regarding these nitro compounds, the nitrobenzyl alcohols and derivatives include 2-nitrobenzyl alcohol, 3-nitrobenzyl alcohol, 4-nitrobenzyl alcohol, 2-nitro-3-methylbenzyl alcohol, 2-nitro-4-methylbenzyl alcohol, 2-nitro-5-methylbenzyl alcohol, 2-nitro-6-methylbenzyl alcohol, 2,3-dinitrobenzyl alcohol, 2,4-dinitrobenzyl alcohol, 2,5-dinitrobenzyl alcohol, 2,6-nitrobenzyl alcohol, etc.

The nitrobenzaldehydes derivatives include 2-nitrobenzaldehyde, 2,4-dinitrobenzaldehyde, 3-nitrobenzaldehyde, 4-nitrobenzaldehyde, 2-nitro-3-methylbenzaldehyde, 2-nitro-4-methylbenzaldehyde, 2-nitro-5-methylbenzaldehyde, 2-nitro-6-methylbenzaldehyde, 2,3-dinitrobenzaldehyde, 2,5-dinitrobenzaldehyde, 2,6-dinitrobenzaldehyde, etc.

The nitrostyrols derivatives include β-nitrostyrol, o-nitrostyrol, m-nitrostyrol, p-nitrostyrol, etc.

The nitroacetophenones derivatives include o-nitroacetophenone, m-nitroacetophenone, p-nitroacetophenone, 2-nitro-3-methylacetophenone, 2-nitro-4-methylacetophenone, 2-nitro-5-methylacetophenone, 2-nitro-6-methylacetophenone, etc.

The nitroanisoles derivatives include o-nitroanisole, m-nitroanisole, p-nitroanisole, 2-nitro-3-methylanisole, 2-nitro-4-methylanisole, 2-nitro-5-methylanisole, 2-nitro-6-methylanisole, etc.

The nitrofurans or its derivatives include nitrofuran compounds such as 2-nitrofuran, anti-5-nitro-2-furaldoxime, 5-nitro-2-furoic acid, 5-nitro-2-furaldehyde, 5-nitro-2-furaldehyde diacetate, 5-nitro-2-furaldehyde semicarbazone and 5-nitro-2-furacrolein.

According to the present invention, it is particularly preferred to use 2-nitrobenzyl alcohol of the following structural formula as the nitrobenzyl alcohol or its derivative, and 2-nitrobenzaldehyde of the following structural formula or 2,4-dinitrobenzaldehyde of the following structural formula as the nitrobenzaldehyde or its derivative.

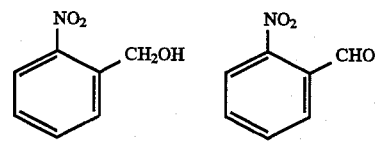

2-Nitrobenzyl alcohol    2-Nitrobenzaldehyde

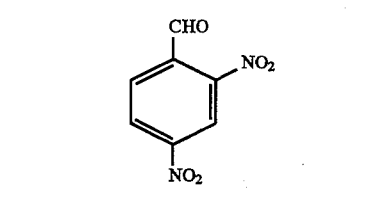

2,4-Dinitrobenzaldehyde

It is also preferred that β-nitrostyrol represented by the following structural formula is used as the nitrostyrol or its derivative, o-nitroacetophenone represented by the following structural formula as the nitroacetophenone derivative and o-nitroanisole represented by the following structural formula as the nitroanisole derivative.

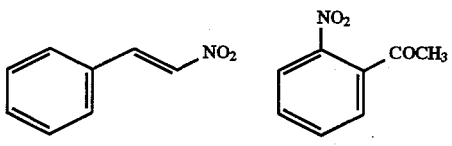

β-Nitrostyrol    o-Nitroacetophenone

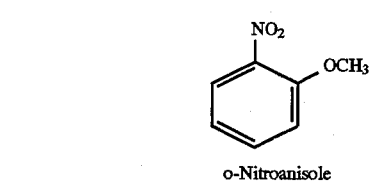

o-Nitroanisole

It is also preferred to use, as the nitrofuran derivative, 2-nitrofuran, anti-5-nitro-2-furaldoxime, 5-nitro-2-furoic acid or 5-nitro-2-furaldehyde represented by the following structural formula:

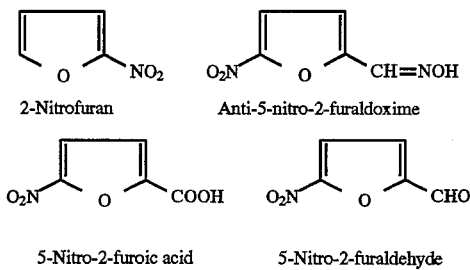

2-Nitrofuran  Anti-5-nitro-2-furaldoxime

5-Nitro-2-furoic acid  5-Nitro-2-furaldehyde

These derivatives may be used alone or as a mixture of two or more thereof.

The content of the one or more nitro compounds (the total content in cases where two or more are used), which are selected from the group consisting of such nitrobenzyl alcohol derivatives, nitrobenzaldehyde derivatives, nitrostyrol derivatives, nitroacetophenone derivatives, nitroanisole derivatives and nitrofuran derivatives as defined above, in the composition for formation of thin-film patterns of a metal oxide according to the present invention is preferred to be 0.05 to 6 times by mole, particularly 0.3 to 2 times by mole, relative to the content of the metal alkoxide (the total content in cases where the composition contains two or more metal alkoxides). The presence of the derivative(s) at contents of less than 0.05 times by mole cannot produce the radiation energy reduction effect of the present invention to the full extent, and the content is required to be 0.3 times or more by mole to accomplish practical levels of sensitivity. In addition, no further increase of the improvement effect can be expected from increase of the content exceeding twice by mole; on the contrary, there occur unwanted problems associated with solubility in the solution, organic residues in the film after thermal treatment, etc. in cases where the content increases over 6 times by mole.

In the present invention, the metal alkoxide is the starting material for the metal oxide, and thus is preferred to be ethoxide, propoxide, isopropoxide, butoxide, isobutoxide or another lower alkoxide of the metal which will constitute the metal oxide to be formed.

The composition for formation of thin-film patterns of a metal oxide according to the present invention my contain another starting material for the metal oxide, such as a metal acetylacetonate complex or a metal carboxylate, in addition to or instead of such a metal alkoxide. Here, the metal carboxylate is preferred to be a lower fatty acid salt such as an acetate or a propionate, without being restricted thereto.

There is no particular limit to combinations and proportions of these starting materials for the metal oxide, and any desired starting material for the metal oxide may be used depending on the particular desired thin film of the metal oxide.

According to the present invention, it is desired that the composition contains a stabilizer which does not have a strong absorptivity for light in the wavelength range of the irradiated light, that is, an agent which prevents hydrolysis of the alkoxy group, to improve the humidity resistance and the time stability of the composition, in addition to the metal alkoxide and the nitro compound.

Such stabilizer may comprise one or more selected from the group consisting of ethanolamines such as ethanolamine, diethanolamine and triethanolamine; β-diketones such as acetylacetone, benzoylacetone and dibenzoylmethane; β-keto esters such as ethyl 3-oxobutanoate; carboxylic acids such as 2-ethylhexanoic acid, 2-ethylbutyric acid, butyric acid and valerianic acid; glycols such as 1,3-butyleneglycol and 2,4-amyleneglycol; and glycol esters.

The amount of addition of the stabilizer, being different depending on the type of the metal alkoxide used, the amount of addition of the nitro compound and desired levels of humidity resistance and time stability, etc., is usually preferred to be 5 times by mole or less, particularly 0.5 to 2 times by mole, relative to the metal alkoxide. The proportion of the stabilizer beyond 5 times by mole relative to the metal alkoxide is not preferred because the photosensitivity is adversely influenced in cases where the stabilizer combines more readily to the metal than to the nitro compound.

The composition and the process according to the present invention may be used with advantages for formation of thin-film patterns of a metal oxide (including both a composite metal oxide and a single metal oxide), such as lead zirconate titanate (PZT), lanthanum-doped lead zirconate titanate (PLZT), strontium titanate (STO), barium titanate (BTO), barium strontium titanate (BSTO), bismuth titanate ($Bi_4Ti_3O_{12}$), tantalum (V) oxide ($Ta_2O_5$), titanium dioxide ($TiO_2$), lead oxide (PbO), zirconium dioxide ($ZrO_2$), alumina ($Al_2O_3$), stannic oxide ($SnO_2$), ruthenium dioxide ($RuO_2$). Formation of thin films of these metal oxides is naturally accomplished through the use of a starting material for each of those metal oxides which contains the alkoxide of the metal constituting each of the metal oxides.

Particularly, the present invention may be advantageously applied to compositions containing two or more of such metal alkoxides, e.g., compositions for formation of thin-film patterns of a lamellar Bi oxide, which contain Sr alkoxides $Sr(OR)_2$ (R: alkyl group), Bi alkoxides $Bi(OR)_3$, Ta alkoxides $Ta(OR)_5$ and/or Nb alkoxides $Nb(OR)_5$ and are represented by the compositional formula: $SrBi_2(Ta_xNb_{2-x})O_9$, or congeners of the compositions where the Bi alkoxides are replaced by one or more selected from the group consisting of bismuth carboxylate, bismuth nitrate, bismuth chloride and bismuth sulfate.

The composition for formation of thin-film patterns of a metal oxide according to the present invention may be prepared by dissolving a starting material for the metal oxide which contains the metal alkoxide in .an appropriate solvent (e.g., an alcohol such as ethanol, isopropanol or 2-methoxyethanol; or a lower aliphatic carboxylic acid such as acetic acid or propionic acid) and then adding to the resulting solution a prescribed amount of the nitro compound, that is, one or more nitro compounds selected from the group consisting of nitrobenzyl alcohol derivatives, nitrobenzaldehyde derivatives, nitrostyrol derivatives, nitroacetophenone derivatives, nitroanisole derivatives and nitrofuran derivatives. In practice, however, it is preferred to preform the complex of the metal oxide and the nitro compound by heating to reflux the metal oxide and the nitro compound in the solvent and then to add a stabilizer and another component to the mixture, thereby allowing improvement of the photosensitivity and reduction in the amount of the nitro compound used. In addition, it is also effective to remove the produced organic matter in order to prevent occurrence of a reverse reaction against the formation of the complex.

Here, in cases where the object is a thin-film pattern of a composite metal oxide, two or mere starting materials for the metal oxide are used in proportions matching the proportions of the respective metals in the object oxide; in this case where two or more metal alkoxides are contained in the composition, it is preferred that the two metal alkoxides are heated to reflux in a solvent to preform a composite alkoxide and that another additive such as a stabilizer is then added to the solution. Also in this case, it is desired that the nitro compound is heated to reflux with the composite alkoxide in the solvent to form a complex. Here, it is also effective to remove the produced organic matter in order to prevent occurrence of a reverse reaction against the formation of the complex.

In this connection, the concentration of the starting material for the metal oxide in the composition is preferred to be within a range of 1–20% by weight.

The method for application of this composition to substrates may be any application method as long as films with even film thicknesses can be formed thereby, but is often spin coating on a commercial scale. If necessary, it is also possible to repeat the application procedures after gelation of the first coating films until the films attain the desired thicknesses. According to the present invention, since addition of one or more nitro compounds, which are selected from the group consisting of nitrobenzyl alcohol derivatives, nitrobenzaldehyde derivatives, nitrostyrol derivatives, nitroacetophenone derivatives, nitroanisole derivatives and nitrofuran derivatives, allows effective exposure to light of low radiation energy, the films can be thickened accordingly. The film thicknesses of the thin films of a metal oxide which are formed using the composition of the present invention are generally preferred to be within a range of 300–1,000 Å.

The resulting coating films may be exposed to light after being allowed to stand for a short time to lose their flowability. The standing times are set to dry the films to such extent as to allow irradiation with light for formation of images (to lose their flowability), and are usually adequate within a range of several seconds to several minutes.

Thereafter, in order to form images conforming to the desired patterns, light is applied for exposure to form the images. The light applied is usually ultraviolet light. The ultraviolet light source my be a ultrahigh pressure mercury lamp, a low-pressure mercury lamp, an excimer laser or the like, for example. The exposure to light for formation of the images may be carried out in a conventional manner by applying light through a mask or by the direct writing method by which patterned laser light is applied in cases where the light source is a laser. There are no particular limits to the amount of radiation energy which, though variable depending on the film thickness and the type of the starting material for the metal oxide, can usually be as small as 0.5–2 J/cm$^2$ due to addition of one or more nitro compounds according to the present invention which are selected from the group consisting of nitrobenzyl alcohol derivatives, nitrobenzaldehyde derivatives, nitrostyrol derivatives, nitroacetophenone derivatives, nitroanisole derivatives and nitrofuran derivatives.

Particularly, in cases where a complex of the metal alkoxide and the nitro compound is formed in advance, the amount of energy can be as small as even 0.1–2 J/cm$^2$ due to the increased photosensitivity.

This irradiation with light causes hardening of the exposed portion due to a photoreaction of the metal alkoxide thereby lowering the solubility of the exposed portion in the solvent such as an alcohol, as will be described later in more detail. According to the present invention, since the one or more nitro confounds selected from the group consisting of nitrobenzyl alcohol derivatives, nitrobenzaldehyde derivatives, nitrostyrol derivatives, nitroacetophenone derivatives, nitroanisole derivatives and nitrofuran derivatives are preferably present as components of the complex of the metal alkoxide, even a small amount of light radiation energy can selectively promote the photoreaction of the metal alkoxide in the exposed portion. For this reason, the object of irradiation with light can be accomplished in a short time even with ultraviolet rays with a low energy density.

If desired, the coated substrates my be allowed to stand in an atmosphere of a dry inert gas ($N_2$, Ar or the like) at 40°–100° C. for 1–10 minutes after the irradiation. The maintenance of the temperature in the moisture-free air achieved as mentioned above further promotes the hardening reaction selectively in the exposed portion of each coating film while preventing the hydrolysis of the coating film components of the non-exposed portion, thus resulting in further increased difference in solubility between the exposed portion and the non-exposed portion.

If necessary, each coating film may be further dried by heating the entire substrate after the irradiation. This drying serves to remove the moisture and the organic solvent remaining in the exposed portion left as the pattern. It is advisable to conduct the heating of the entire substrate at, for example, 100°–150° C. for 5–10 minutes.

Subsequently, removal of the non-hardened coating film in the non-exposed portion by development with an appropriate solvent results in formation of a negative pattern composed of the exposed portion on each substrate. The solvent used as the developing agent may be any one which dissolves the materials of the non-exposed portion, but barely dissolves the hardened film in the exposed portion, and is usually preferred to be water or an alcohol. An appropriate alcohol is an alkoxy alcohol such as 2-methoxyethanol or 2-ethoxyethanol. In cases where the alkoxy alcohol to be used is such a solvent as to cause dissolution of the exposed portion, an alkyl alcohol such as ethyl alcohol or isopropyl alcohol (IPA) can be added thereto to control the solubility.

The development can be completed in approximately 10 seconds to 10 minutes by immersion in a solvent at room temperature. The developing conditions are set so as to completely remove the non-exposed portion but not substantially remove the exposed portion. Accordingly, the developing conditions are set differently depending on the amount of light applied, the presence or absence of subsequent heat treatment and the type of the solvent used for the development.

After the development, that is, after having been pulled up from the developing solution, the coated sample may be immersed in a rinse to wash off the developing solution, if necessary, to prevent dissolution of the remaining coating film in the developing solution deposited thereon and to terminate the development completely. The rinse must barely dissolve the film and be readily miscible with the developing solution, and it is usually advantageous to use a lower alcohol as the rinse. An appropriate alcohol is ethyl alcohol or isopropyl alcohol.

A negative pattern of the coating film composed of the remaining exposed portion is formed on the substrate in this way. Thereafter, the thin film pattern of a metal oxide having a desired composition is provided by completely converting the metal compound in the coating film to the metal oxide by heat treatment of the coated substrate. This heat treatment is usually preferred to be achieved by firing in the atmosphere at 300°–800° C. for 1 second to 2 hours.

If necessary, an additional thin-film pattern of the same or a different metal oxide may be laid on the thin-film pattern of the metal oxide formed in this way.

Electronic parts which can be prepared in the manner as described above include DRAMs, nonvolatile ferroelectric thin-film memories, bipolar memories, semiconductor memories such as GaAsIC, liquid crystal devices, capacitor arrays, etc.

On the other hand, optics which can be prepared in the same manner as the above include optical guides, thin-film optical isolators, Fresnel lenses and so on.

The process for formation of thin films according to the present invention will now be explained.

The process for formation of thin films according to the present invention is based on LSMCVD and is characterized in that a photoreactive confound is incorporated in the starting solution to be subjected to LSMCVD, and the mist deposited on a substrate (in practice the surface of the substrate) is irradiated with light in order to ensure the deposition of the mist on the substrate. As mentioned above, spin coating or the like may also be used as well as LSMCVD.

In this specification, "light" mainly but nonrestrictively refers to light in a wavelength range of 200–400 nm.

According to the present invention, although the photoreactive compound is not required to meet particular conditions other than being capable of absorbing such light to efficiently produce a precipitate which is insoluble or barely soluble in the solvent of the starting solution, it is preferred to comprise one or more nitro compounds selected from the group consisting of such nitrobenzyl alcohol derivatives, nitrobenzaldehyde derivatives, nitrostyrol derivatives, nitroacetophenone derivatives, nitroanisole derivatives and nitrofuran derivatives as referred to above.

According to the process for formation of thin films according to the present invention, the content of the one or more nitro compounds (the total content in cases where two or more are used) in the starting solution is preferred to be 0.05 to 6 times by mole, particularly 0.3 to 2 times by mole, relative to the content of the organic metal compound (the total content in cases where the composition contains two or mere organic metal compounds). The presence of the photoreactive compound at contents of less than 0.05 times by mole cannot produce the effect of improving the step coverage according to the present invention to the full extent, and the content is required to be 0.3 times or more by mole to accomplish practical levels of sensitivity. In addition, no further increase of the improvement effect can be expected from increase of the content exceeding twice by mole; on the contrary, there occur unwanted problems associated with solubility in the solution, organic residues in the film after heat treatment, etc. in cases where the content increases over 6 times by mole.

The organic metal compound is the starting material for the thin film to be formed, and thus is preferred to be an organic compound of the metal which is contained in the thin film to be formed, for example, ethoxide, propoxide, isopropoxide, butoxide, isobutoxide or another lower alkoxide of the metal. A metal acetylacetonate complex or a metal carboxylate my be used in addition to or instead of such a metal alkoxide. Here, the metal carboxylate is preferred to be a lower fatty acid salt such as an acetate or a propionate, without being restricted thereto.

There is no particular limit to combinations and proportions of these starting materials for the organic metal compound, and any desired starting material for the organic metal compound may be used depending on the particular objective thin film.

The starting solution is prepared by dissolving such an organic metal compound and a photoreactive compound as described above in an appropriate solvent (e.g., an alcohol such as ethanol, isopropanol or 2-methoxyethanol; a lower aliphatic carboxylic acid such as acetic acid or propionic acid; etc.). Here, the solute concentration is preferred to be within a range of 0.1 to 10% by weight in terms of the metal oxide.

According to the process for formation of thin films according to the present invention, the starting solution prepared in this way is misted with an ultrasonic mist generator and sent to the surface of each substrate on which a thin film is to be formed, to deposit and accumulate the mist on the substrate heated to 50°–150° C. The mist-deposited and accumulated surface of the substrate is irradiated with light to accelerate the formation of a coating film of the deposited mist.

The light to be applied here is usually ultraviolet light. The ultraviolet light source may be a ultrahigh pressure mercury lamp, a low-pressure mercury lamp or an excimer laser, for example. The amount of radiation energy may be on the order of 1–50 mW/cm$^2$.

The thin film formed in this way, after being further dried if necessary, is fired in the atmosphere to completely convert the metal compound in the thin film to a metal oxide, thus providing a thin film of the metal oxide. In addition, firing of the thin film of the metal oxide in a gas of hydrogen sulfide results in conversion of the metal oxide to a metal sulfide thereby forming a thin film of the metal sulfide.

The process for formation of thin films according to the present invention is especially effective for forming a variety of dielectric thin films such as PZT thin films, BST thin films, SBT thin films and LN thin films on Si wafers with steps on the order of 0.5 to 5 µm which have been prepared by patterning of SiO$_2$ films.

The process for formation of thin films according to the present invention as described above is exceedingly effective for preparing electronic parts or optics with thin films of metal oxides or thin films of metal sulfides. The process according to the present invention is particularly suitable for preparing electronic parts such as DRAMs, nonvolatile ferroelectric memories, bipolar memories, GaAs, ICs, liquid crystal devices and capacitor arrays, and optics such as optical guides, thin-film optical isolators and Fresnel lenses.

DESCRIPTION OF THE PREFERRED EMBODIMENTS

The present invention will now be explained more specifically with reference to Examples and Comparative examples, without being restricted to the Examples.

EXAMPLE 1

A 11.65-g portion of lead acetate trihydrate was added to 75 g of 2-methoxyethanol, and the resulting mixture was heated to dissolution for dehydration as an azeotropic mixture thereby providing a solution of anhydrous lead acetate. To this solution there were added 6.12 g of zirconium tetra-n-butoxide, 4.19 g of titanium tetra-isopropoxide and 2-methoxyethanol in an amount required to adjust the total weight of the mixture to 100 g thereby providing a 10% by weight solution of PbZr$_{0.52}$Ti$_{0.48}$O$_3$ (PZT), and 2-nitrobenzyl alcohol was added thereto in each of the proportions indicated in TABLE 1 to provide compositions for formation of PZT thin-film patterns.

Each of the resulting compositions was applied onto a silicon substrate to a film thickness of 500 Å by spin coating, and thereafter the coating film was irradiated with ultraviolet rays having the amount of energy indicated in TABLE 1 through a photomask and was then immersed in a 1:1 (volumetric ratio) mixed solvent of 2-methoxyethanol and isopropyl alcohol for 10 seconds for development. The results of patterning are evaluated in TABLE 1 as being satisfactory (o) or unsatisfactory (x).

TABLE 1

| Amount of 2-nitrobenzyl alcohol added (molar ratio to alkoxide) | Amount of light radiation energy (J/cm$^2$) | | | | | |
| --- | --- | --- | --- | --- | --- | --- |
| | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 2

A 32.9-g portion of a 5% by weight Ba solution prepared with barium octylate and isoamyl acetate, 21.03 g of a 5% by weight Sr solution prepared with strontium octylate and isoamyl acetate and 6.82 g of titanium tetra-isopropoxide were mixed, and the total weight of the resulting mixture was increased to 100 g by addition of isoamyl acetate thereto to prepare a 5% by weight solution of $Ba_{0.5}Sr_{0.5}TiO_3$ (BST) to which 2-nitrobenzyl alcohol was added in each of the proportions indicated in TABLE 2 to provide compositions for formation of BST thin-film patterns.

The resulting compositions were subjected to exposure to light and development in the same manner as in Example 1; the results of patterning are evaluated in TABLE 2 as being satisfactory (o) or unsatisfactory (x).

TABLE 2

| Amount of 2-nitrobenzyl alcohol added (molar ratio to alkoxide) | Amount of light radiation energy (J/cm$^2$) | | | | | |
| --- | --- | --- | --- | --- | --- | --- |
| | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 3

A 8.68-g portion of a 5% by weight Sr solution prepared with strontium octylate and isoamyl acetate, 41.21 g of a 5% by weight Bi solution prepared with bismuth octylate and isoamyl acetate and 4.02 g of tantalum pentaethoxide were mixed, and the total weight of the resulting mixture was increased to 100 g by addition of a 1:1 (volumetric ratio) mixed solvent of isoamyl acetate and 2-methoxyethanol thereto to prepare a 5% by weight solution of $SrBi_2Ta_2O_3$ to which 2-nitrobenzyl alcohol was added in each of the proportions indicated in TABLE 3 to provide compositions for formation of $SrBi_2Ta_2O_9$ thin-film patterns.

The resulting compositions were subjected to exposure to light and development in the same manner as in Example 1; the results of patterning are evaluated in TABLE 3 as being satisfactory (o) or unsatisfactory (x).

TABLE 3

| Amount of 2-nitrobenzyl alcohol added (molar ratio to alkoxide) | Amount of light radiation energy (J/cm$^2$) | | | | | |
| --- | --- | --- | --- | --- | --- | --- |
| | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 4

A 1.76-g portion of lithium ethoxide, 10.76 g of niobium pentaethoxide and 87.48 g of 2-methoxyethanol were mixed to prepare a 5% by weight solution of $LiNbO_3$ to which 2-nitrobenzyl alcohol was added in each of the proportions indicated in TABLE 4 to provide compositions for formation of $LiNbO_3$ thin-film patterns.

The resulting compositions were subjected to exposure to light and development in the same manner as in Example 1; the results of patterning are evaluated in TABLE 4 as being satisfactory (o) or unsatisfactory (x).

TABLE 4

| Amount of 2-nitrobenzyl alcohol added (molar ratio to alkoxide) | Amount of light radiation energy (J/cm$^2$) | | | | | |
| --- | --- | --- | --- | --- | --- | --- |
| | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 5

A 71.26-g portion of a 5% by weight Bi solution prepared with bismuth octylate and isoamyl acetate and 3.65 g of titanium tetra-isopropoxide were mixed, and the total weight of the resulting mixture was increased to 100 g by addition of a 1:1 (volumetric ratio) mixed solvent of isoamyl acetate and 2-methoxyethanol thereto to prepare a 5% by weight solution of $Bi_4Ti_3O_{12}$ to which 2-nitrobenzyl alcohol was added in each of the proportions indicated in TABLE 5 to provide compositions for formation of $Bi_4Ti_3O_{12}$ thin-film patterns.

The resulting compositions were subjected to exposure to light and development in the same manner as in Example 1; the results of patterning are evaluated in TABLE 5 as being satisfactory (o) or unsatisfactory (x).

TABLE 5

| Amount of 2-nitrobenzyl alcohol added (molar ratio to alkoxide) | Amount of light radiation energy (J/cm$^2$) | | | | | |
| --- | --- | --- | --- | --- | --- | --- |
| | 0.1 | 0.5 | 1 | 3 | 5 | 10 |
| 0 | x | x | x | x | x | o |
| 0.02 | x | x | x | x | x | o |

TABLE 5-continued

| Amount of 2-nitrobenzyl alcohol added (molar ratio to alkoxide) | Amount of light radiation energy (J/cm$^2$) | | | | | |
|---|---|---|---|---|---|---|
| | 0.1 | 0.5 | 1 | 3 | 5 | 10 |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 6

In the same manner as in Example 1, except that 2-nitrobenzaldehyde was used in each of the proportions indicated in TABLE 6 instead of the 2-nitrobenzyl alcohol, compositions for formation of PZT thin films were obtained and then subjected to exposure to light and development; the results of patterning are evaluated in TABLE 6 as being satisfactory (o) or unsatisfactory (x).

TABLE 6

| Amount of 2-nitrobenz-aldehyde added (molar ratio to alkoxide) | Amount of light radiation energy (J/cm$^2$) | | | | | |
|---|---|---|---|---|---|---|
| | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 7

In the same manner as in Example 2, except that 2-nitrobenzaldehyde was used in each of the proportions indicated in TABLE 7 instead of the 2-nitrobenzyl alcohol, compositions for formation of BST thin films were obtained and then subjected to exposure to light and development; the results of patterning are evaluated in TABLE 7 as being satisfactory (o) or unsatisfactory (x).

TABLE 7

| Amount of 2-nitrobenz-aldehyde added (molar ratio to alkoxide) | Amount of light radiation energy (J/cm$^2$) | | | | | |
|---|---|---|---|---|---|---|
| | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 8

In the same manner as in Example 3, except that 2-nitrobenzaldehyde was used in each of the proportions indicated in TABLE 8 instead of the 2-nitrobenzyl alcohol, compositions for formation of SrBi$_2$Ta$_2$O$_9$ thin films were obtained and then subjected to exposure to light and development; the results of patterning are evaluated in TABLE 8 as being satisfactory (o) or unsatisfactory (x).

TABLE 8

| Amount of 2-nitrobenz-aldehyde added (molar ratio to alkoxide) | Amount of light radiation energy (J/cm$^2$) | | | | | |
|---|---|---|---|---|---|---|
| | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 9

In the same manner as in Example 4, except that 2-nitrobenzaldehyde was used in each of the proportions indicated in TABLE 9 instead of the 2-nitrobenzyl alcohol, compositions for formation of LiNbO$_3$ thin films were obtained and then subjected to exposure to light and development; the results of patterning are evaluated in TABLE 9 as being satisfactory (o) or unsatisfactory (x).

TABLE 9

| Amount of 2-nitrobenz-aldehyde added (molar ratio to alkoxide) | Amount of light radiation energy (J/cm$^2$) | | | | | |
|---|---|---|---|---|---|---|
| | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 10

In the same manner as in Example 5, except that 2-nitrobenzaldehyde was used in each of the proportions indicated in TABLE 10 instead of the 2-nitrobenzyl alcohol, compositions for formation of Bi$_4$Ti$_3$O$_{12}$ thin films were obtained and then subjected to exposure to light and development; the results of patterning are evaluated in TABLE 10 as being satisfactory (o) or unsatisfactory (x).

TABLE 10

| Amount of 2-nitrobenz-aldehyde added (molar ratio to alkoxide) | Amount of light radiation energy (J/cm$^2$) | | | | | |
|---|---|---|---|---|---|---|
| | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 11

In the same manner as in Example 1, except that 2,4-dinitrobenzaldehyde was used in each of the proportions indicated in TABLE 11 instead of the 2-nitrobenzyl alcohol, compositions for formation of PZT thin films were obtained and then subjected to exposure to light and development; the results of patterning are evaluated in TABLE 11 as being satisfactory (o) or unsatisfactory (x).

TABLE 11

| Amount of 2,4-dinitro-benzaldehyde added | Amount of light radiation energy (J/cm$^2$) | | | | | |
|---|---|---|---|---|---|---|
| (molar ratio to alkoxide) | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 12

In the same manner as in Example 2, except that 2,4-dinitrobenzaldehyde was used in each of the proportions indicated in TABLE 12 instead of the 2-nitrobenzyl alcohol, compositions for formation of BST thin films were obtained and then subjected to exposure to light and development; the results of patterning are evaluated in TABLE 12 as being satisfactory (o) or unsatisfactory (x).

TABLE 12

| Amount of 2,4-dinitro-benzaldehyde added | Amount of light radiation energy (J/cm$^2$) | | | | | |
|---|---|---|---|---|---|---|
| (molar ratio to alkoxide) | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 13

In the same manner as in Example 3, except that 2,4-dinitrobenzaldehyde was used in each of the proportions indicated in TABLE 13 instead of the 2-nitrobenzyl alcohol, compositions for formation of SrBi$_2$Ta$_2$O$_9$ thin films were obtained and then subjected to exposure to light and development; the results of patterning are evaluated in TABLE 13 as being satisfactory (o) or unsatisfactory (x).

TABLE 13

| Amount of 2,4-dinitro-benzaldehyde added | Amount of light radiation energy (J/cm$^2$) | | | | | |
|---|---|---|---|---|---|---|
| (molar ratio to alkoxide) | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 14

In the same manner as in Example 4, except that 2,4-dinitrobenzaldehyde was used in each of the proportions indicated in TABLE 14 instead of the 2-nitrobenzyl alcohol, compositions for formation of LiNbO$_3$ thin films were obtained and then subjected to exposure to light and development; the results of patterning are evaluated in TABLE 14 as being satisfactory (o) or unsatisfactory (x).

TABLE 14

| Amount of 2,4-dinitro-benzaldehyde added | Amount of light radiation energy (J/cm$^2$) | | | | | |
|---|---|---|---|---|---|---|
| (molar ratio to alkoxide) | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 15

In the same manner as in Example 5, except that 2,4-dinitrobenzaldehyde was used in each of the proportions indicated in TABLE 15 instead of the 2-nitrobenzyl alcohol, compositions for formation of Bi$_4$Ti$_3$O$_{12}$ thin films were obtained and then subjected to exposure to light and development; the results of patterning are evaluated in TABLE 15 as being satisfactory (o) or unsatisfactory (x).

TABLE 15

| Amount of 2,4-dinitro-benzaldehyde added | Amount of light radiation energy (J/cm$^2$) | | | | | |
|---|---|---|---|---|---|---|
| (molar ratio to alkoxide) | 0.1 | 0.5 | 1 | 3 | 5 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

TABLE 1 through TABLE 15 clearly show that addition of a prescribed proportion of a nitrobenzyl alcohol derivative and/or a nitrobenzaldehyde derivative results in significant reduction in the amount of radiation energy which is required for exposure.

EXAMPLE 16

In the same manner as in Example 1, except that an equimolar amount of 2-nitrobenzyl alcohol relative to the metal alkoxide was added, and a 1.5-fold molar amount of each of the stabilizers indicated in TABLE 16 relative to the metal alkoxide was added, there were prepared compositions for formation of PZT thin-film patterns.

Each of the resulting compositions was applied onto a silicon substrate to a film thickness of 500 Å by spin coating. The coating film was irradiated with 2 J/cm$_2$ of ultraviolet rays through a photomask and was then allowed to stand in a constant-temperature, constant-humidity room at room temperature (25° C.) and at a humidity of 70% for each of the times indicated in TABLE 16; thereafter each coating film was immersed in a 1:2 (volumetric ratio) mixed solvent of 2-methoxyethanol and isopropyl alcohol for 10 seconds for development, and the time stability was determined on the basis of the state of patterning, with the results shown in TABLE 16. In TABLE 16, "O" indicates successful patterning, and "x" indicates unsuccessful patterning due to insolubilization of the non-light-irradiated portion by hydrolysis by the moisture in the air.

TABLE 16

| Stabilizer | Standing time (min.) | | | | | |
|---|---|---|---|---|---|---|
| | 0 | 10 | 30 | 60 | 120 | 300 |
| Not added | o | o | x | x | x | x |
| Acetylacetone | o | o | o | o | o | o |
| Ethyl 3-oxobutanoate | o | o | o | o | o | x |
| 2-Ethylhexanoic acid | o | o | o | o | o | o |
| 2-Ethylbutyric acid | o | o | o | o | o | o |
| Ethanolamine | o | o | o | o | o | o |

EXAMPLE 17

In the same manner as in Example 2, except that an equimolar amount of 2-nitrobenzaldehyde relative to the metal alkoxide was added instead of the 2-nitrobenzyl alcohol, and a 1.5-fold molar amount of each of the stabilizers indicated in TABLE 17 relative to the metal alkoxide was added, there were prepared compositions for formation of BST thin-film patterns.

In the same manner as in Example 16, each of the resulting compositions was applied, irradiated with light, allowed to stand and developed, and then the time stability was determined, with the results shown in TABLE 17.

TABLE 17

| Stabilizer | Standing time (min.) | | | | | |
|---|---|---|---|---|---|---|
| | 0 | 10 | 30 | 60 | 120 | 300 |
| Not added | o | o | x | x | x | x |
| Acetylacetone | o | o | o | o | o | o |
| Ethyl 3-oxobutanoate | o | o | o | o | o | x |
| 2-Ethylhexanoic acid | o | o | o | o | o | o |
| 2-Ethylbutyric acid | o | o | o | o | o | o |
| Ethanolamine | o | o | o | o | o | o |

EXAMPLE 18

In the same manner as in Example 1, except that an equimolar amount of 2,4-dinitrobenzaldehyde relative to the metal alkoxide was added instead of the 2-nitrobenzyl alcohol, and a 1.5-fold molar amount of each of the stabilizers indicated in TABLE 18 relative to the metal alkoxide was added, there were prepared compositions for formation of PZT thin-film patterns.

In the same manner as in Example 16, each of the resulting compositions was applied, irradiated with light, allowed to stand and developed, and then the time stability was determined, with the results shown in TABLE 18.

TABLE 18

| Stabilizer | Standing time (min.) | | | | | |
|---|---|---|---|---|---|---|
| | 0 | 10 | 30 | 60 | 120 | 300 |
| Not added | o | o | x | x | x | x |
| Acetylacetone | o | o | o | o | o | o |
| Ethyl 3-oxobutanoate | o | o | o | o | o | x |
| 2-Ethylhexanoic acid | o | o | o | o | o | o |

TABLE 18-continued

| Stabilizer | Standing time (min.) | | | | | |
|---|---|---|---|---|---|---|
| | 0 | 10 | 30 | 60 | 120 | 300 |
| 2-Ethylbutyric acid | o | o | o | o | o | o |
| Ethanolamine | o | o | o | o | o | o |

EXAMPLE 19

A 32.96-g portion of a 5% by weight solution of barium 2-methoxyethoxide in terms of barium which has been prepared by dissolving metal Ba in 2-methoxyethanol, 21.03 g of a 5% by weight solution of strontium 2-methoxyethoxide in terms of strontium which has been prepared by dissolving metal Sr in 2-methoxyethanol and 6.82 g of titanium tetraisopropoxide were mixed, and the total weight of the mixture was adjusted to 100 g by addition of 2-methoxyethanol thereto to prepare a 5% by weight solution of $Ba_{0.5}Sr_{0.5}TiO_3$ (BST) to which an equimolar amount of 2-nitrobenzaldehyde relative to the metal alkoxide was added and further a 1.5-fold molar amount of each of the stabilizers indicated in TABLE 19 relative to the metal alkoxide was added to prepare compositions for formation of BST thin-film patterns.

In the same manner as in Example 16, each of the resulting compositions was applied, irradiated with light, allowed to stand and developed, and then the time stability was determined, with the results shown in TABLE 19.

TABLE 19

| Stabilizer | Standing time (min.) | | | | | |
|---|---|---|---|---|---|---|
| | 0 | 10 | 30 | 60 | 120 | 300 |
| Not added | o | o | x | x | x | x |
| Acetylacetone | o | o | o | o | o | o |
| Ethyl 3-oxobutanoate | o | o | o | o | o | x |
| 2-Ethylhexanoic acid | o | o | o | o | o | o |
| 2-Ethylbutyric acid | o | o | o | o | o | o |
| Ethanolamine | o | o | o | o | o | o |

EXAMPLE 20

A 12.28-g portion of tin tetra-t-butoxide $Sn(O-t-Bu)_4$ and 1.05 g of antimony tributoxide $Sb(OBu)_3$ were dissolved in 86.67 g of 2-methoxyethanol to prepare a 5% by weight ATO solution. To this solution there were added a 2-fold molar amount of 2-nitrobenzaldehyde relative to the metal alkoxide (the total of the molar numbers of Sn and Sb) and then a 1.5-fold molar amount of each of the stabilizers indicated in TABLE 20 relative to the metal alkoxide to prepare compositions for formation of ATO thin-film patterns.

In the same manner as in Example 16, each of the resulting compositions was applied, irradiated with light, allowed to stand and developed, and then the time stability was determined, with the results shown in TABLE 20.

TABLE 20

| Stabilizer | Standing time (min.) | | | | | |
|---|---|---|---|---|---|---|
| | 0 | 10 | 30 | 60 | 120 | 300 |
| Not added | o | o | x | x | x | x |
| Acetylacetone | o | o | o | o | o | o |
| Ethyl 3-oxobutanoate | o | o | o | o | o | x |
| 2-Ethylhexanoic acid | o | o | o | o | o | o |
| 2-Ethylbutyric acid | o | o | o | o | o | o |
| Ethanolamine | o | o | o | o | o | o |

TABLES 16 through 20 clearly show that addition of the stabilizers results in improvement in the time stability of the compositions for formation of thin-film patterns of a metal oxide in a high-humidity environment.

EXAMPLE 21

Each of the metal alkoxides indicated in TABLE 21 was dissolved in 2-methoxyethanol, and 2-nitrobenzyl alcohol was added to the resulting solution in each of the amounts (molar ratios) indicated in TABLE 21, and the mixture was heated to reflux for 5 hours to form a complex of the metal alkoxide and the 2-nitrobenzyl alcohol. Each of the resulting solutions was applied onto a silicon substrate to a film thickness of 500 Å by spin coating. Each coating film was irradiated with 0.05 J/cm$^2$ of ultraviolet rays through a photomask, and then immersed in a 1:2 (volumetric ratio) mixed solvent of 2-methoxyethanol and isopropyl alcohol for 10 seconds for development. The results of patterning are evaluated in TABLE 21 as being satisfactory (o) or unsatisfactory (x).

TABLE 21

| Metal alkoxide | Amount of 2-nitrobenzyl alcohol added (molar ratio to alkoxide) | Result of patterning |
|---|---|---|
| Lead diisopropoxide Pb (O-i-Pr)$_2$ | 0.5 | o |
| | 1 | o |
| | 2 | o |
| Zirconium tetra-n-butoxide Zr (O-n-Bu)$_4$ | 0.5 | o |
| | 2 | o |
| | 4 | o |
| Titanium tetra-isopropoxide Ti (O-i-Pr)$_4$ | 0.5 | o |
| | 2 | o |
| | 4 | o |
| Barium diisopropoxide Ba (O-i-Pr)$_2$ | 0.5 | o |
| | 1 | o |
| | 2 | o |
| Strontium diisopropoxide Sr (O-i-Pr)$_2$ | 0.5 | o |
| | 1 | o |
| | 2 | o |
| Bismuth tri-t-pentoxide Bi (O-t-Pe)$_3$ | 0.5 | o |
| | 2 | o |
| | 3 | o |
| Tantalum pentaethoxide Ta (OEt)$_5$ | 1 | o |
| | 3 | o |
| | 5 | o |
| Niobium pentaethoxide Nb (OEt)$_5$ | 1 | o |
| | 3 | o |
| | 5 | o |

EXAMPLE 22

In the same manner as in Example 21, except that 2-nitrobenzaldehyde was used instead of the 2-nitrobenzyl alcohol, complexes were formed, applied, irradiated with light and developed, and the results of patterning are evaluated in TABLE 22 as being satisfactory (o) or unsatisfactory (x).

TABLE 22

| Metal alkoxide | Amount of 2-nitrobenz-aldehyde added (molar ratio to alkoxide) | Result of patterning |
|---|---|---|
| Lead diisopropoxide Pb (O-i-Pr)$_2$ | 0.5 | o |
| | 1 | o |
| | 2 | o |
| Zirconium tetra-n-butoxide Zr (O-n-Bu)$_4$ | 0.5 | o |
| | 2 | o |
| | 4 | o |
| Titanium tetra-isopropoxide Ti (O-i-Pr)$_4$ | 0.5 | o |
| | 2 | o |
| | 4 | o |
| Barium diisopropoxide Ba (O-i-Pr)$_2$ | 0.5 | o |
| | 1 | o |
| | 2 | o |
| Strontium diisopropoxide Sr (O-i-Pr)$_2$ | 0.5 | o |
| | 1 | o |
| | 2 | o |
| Bismuth tri-t-pentoxide Bi (O-t-Pe)$_3$ | 0.5 | o |
| | 2 | o |
| | 3 | o |
| Tantalum pentaethoxide Ta (OEt)$_5$ | 1 | o |
| | 3 | o |
| | 5 | o |
| Niobium pentaethoxide Nb (OEt)$_5$ | 1 | o |
| | 3 | o |
| | 5 | o |

EXAMPLE 23

In the same manner as in Example 21, except that 2,4-dinitrobenzaldehyde was used instead of the 2-nitrobenzyl alcohol, complexes were formed, applied, irradiated with light and developed, and the results of patterning are evaluated in TABLE 23 as being satisfactory (o) or unsatisfactory (x).

TABLE 23

| Metal alkoxide | Amount of 2,4-dinitro-benzaldehyde added (molar ratio to alkoxide) | Result of patterning |
|---|---|---|
| Lead diisopropoxide Pb (O-i-Pr)$_2$ | 0.5 | o |
| | 1 | o |
| | 2 | o |
| Zirconium tetra-n-butoxide Zr (O-n-Bu)$_4$ | 0.5 | o |
| | 2 | o |
| | 4 | o |
| Titanium tetra-isopropoxide Ti (O-i-Pr)$_4$ | 0.5 | o |
| | 2 | o |
| | 4 | o |
| Barium diisopropoxide Ba (O-i-Pr)$_2$ | 0.5 | o |
| | 1 | o |
| | 2 | o |
| Strontium diisopropoxide Sr (O-i-Pr)$_2$ | 0.5 | o |
| | 1 | o |
| | 2 | o |
| Bismuth tri-t-pentoxide Bi (O-t-Pe)$_3$ | 0.5 | o |
| | 2 | o |
| | 3 | o |
| Tantalum pentaethoxide Ta (OEt)$_5$ | 1 | o |
| | 3 | o |
| | 5 | o |
| Niobium pentaethoxide Nb (OEt)$_5$ | 1 | o |
| | 3 | o |
| | 5 | o |

TABLES 21 through 23 clearly show that formation of the complexes of the metal alkoxides and the nitro compounds allows patterning upon exposure to low-energy light even in cases where a small amount of each of the nitro compounds is added.

EXAMPLE 24

2-Nitrobenzaldehyde in each of the proportions indicated in TABLE 24 was added to a composite alkoxide of $Bi_2SrTa_2$ formed by heating to reflux a mixture of 9.3 g of bismuth t-pentoxide, 8.71 g of tantalum ethoxide and 8.03 g of a 9.95% by weight solution of strontium in 2-methoxyethanol to form a complex, and 2.3 g of 2-ethylbutyric acid was added to the complex to prevent the highly hydrolytic action of the remaining functional groups of the composite alkoxide thereby stabilizing the solution, and finally the weight of the mixture was adjusted by addition of 2-methoxyethanol thereto to prepare 100 g of a 10% by weight $Bi_2SrTa_2O_9$ composition for formation of thin-film patterns.

Each of the resulting compositions was applied onto a silicon substrate to a film thickness of 800 Å by spin coating, and thereafter the coating film was irradiated with ultraviolet rays having the amount of energy indicated in TABLE 24 through a photomask and was then immersed in isopropyl alcohol used as the solvent for 10 seconds for development. The results of patterning are evaluated in TABLE 24 as being satisfactory (o) or unsatisfactory (x).

TABLE 24

| Amount of 2-nitrobenz-aldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

EXAMPLE 25

In the same manner as in Example 24, except that 6.17 g of ethoxy diethyl bismuth was used instead of the Bi t-pentoxide, a 10% by weight $Bi_2SrTa_2O_0$ composition for formation of thin-film patterns was prepared, exposed to light and developed, and the results of patterning are evaluated in TABLE 25 as being satisfactory (o) or unsatisfactory (x).

TABLE 25

| Amount of 2-nitrobenz-aldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

EXAMPLE 26

In the same manner as in Example 24, except that 2-nitrobenzyl alcohol in each of the proportions indicated in TABLE 26 was added instead of the 2-nitrobenzaldehyde, a 10% by weight $Bi_2SrTa_2O_0$ composition for formation of thin-film patterns was prepared, exposed to light and developed, and the results of patterning are evaluated in TABLE 26 as being satisfactory (o) or unsatisfactory (x).

TABLE 26

| Amount of 2-nitrobenzyl alcohol added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

EXAMPLE 27

In the same manner as in Example 24, except that 2-ethylhexanoic acid was added as the stabilizer instead of the 2-ethylbutyric acid, a 10% by weight $Bi_2SrTa_2O_9$ composition for formation of thin-film patterns was prepared, exposed to light and developed, and the results of patterning are evaluated in TABLE 27 as being satisfactory (o) or unsatisfactory (x).

TABLE 27

| Amount of 2-nitrobenz-aldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | x |
| 0.02 | x | x | x | o | o | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 28

To a solution prepared by mixing 10.19 g of bismuth t-pentoxide, 9.54 g of a strontium alkoxide, 4.4 g of tantalum ethoxide and 3.45 g of niobium ethoxide there were added 2-nitrobenzaldehyde in each of the proportions indicated in TABLE 28 and then 2-ethylbutyric acid, and the weight of the resulting mixture was finally adjusted to 100 g by addition of 2-methoxyethanol to prepare a 10% by weight $Bi_2SrTa_2O_9$ composition for formation of thin-film patterns which was then exposed to light and developed in the same manner as in Example 24, with the results shown in 28 wherein the patterning is evaluated to be satisfactory (o) or unsatisfactory (x).

TABLE 28

| Amount of 2-nitrobenz-aldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | x |
| 0.02 | x | x | o | o | o | o |
| 0.05 | x | x | o | o | o | o |
| 0.1 | x | o | o | o | o | o |
| 1 | o | o | o | o | o | o |

TABLE 28-continued

| Amount of 2-nitrobenz-aldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 2 | o | o | o | o | o | o |
| 4 | o | o | o | o | o | o |

EXAMPLE 29

To form complexes, 2-nitrobenzaldehyde in each of the proportions indicated in TABLE 29 was added to 100 g of a 15% by weight solution of a composite alkoxide of $SrTa_2$ formed by heating to reflux a mixture of 27.1 g of tantalum ethoxide and 29.4 g of a 9.95% by weight solution of strontium in 2-methoxyethanol and dissolving the mixture in 2-methoxyethanol, and 7.8 g of 2-ethylbutyric acid was added to each of the complexes to prevent the highly hydrolytic action of the remaining functional groups of the composite alkoxide thereby stabilizing the solution, and after addition of a 9.63% by weight solution of bismuth 2-ethylhexanoate in isoamyl acetate to the solution, the solution was finally adjusted by addition of 2-methoxyethanol thereto to prepare a 10% by weight $Bi_2SrTa_2O_9$ composition for formation of thin-film patterns.

The resulting compositions were exposed to light and developed in the same manner as in Example 24, with the results shown in TABLE 29 wherein the patterning is evaluated to be satisfactory (o) or unsatisfactory (x).

TABLE 29

| Amount of 2-nitrobenz-aldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

EXAMPLE 30

In the same manner as in Example 29, except that 2-nitrobenzyl alcohol in each of the proportions indicated in TABLE 30 was added instead of the 2-nitrobenzaldehyde, a 10% by weight $Bi_2SrTa_2O_9$ composition for formation of thin-film patterns was prepared, exposed to light and developed, and the results of patterning are evaluated in TABLE 30 as being satisfactory (o) or unsatisfactory (x).

TABLE 30

| Amount of 2-nitrobenzyl alcohol added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |

TABLE 30-continued

| Amount of 2-nitrobenzyl alcohol added (molar ratio to alkoxide) | Amount of light radiation energy (J/cm²) | | | | | |
|---|---|---|---|---|---|---|
| | 0.5 | 1 | 3 | 5 | 8 | 10 |
| 2 | o | o | o | o | o | o |
| 4 | o | o | o | o | o | o |

EXAMPLE 31

In the same manner as in Example 29, except that 2-ethylhexanoic acid was added as the stabilizer instead of the 2-ethylbutyric acid, a 10% by weight $Bi_2SrTa_2O_9$ composition for formation of thin-film patterns was prepared, exposed to light and developed, and the results of patterning are evaluated in TABLE 31 as being satisfactory (o) or unsatisfactory (x).

TABLE 31

| Amount of 2-nitrobenz-aldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 32

In the same manner as in Example 29, except that a solution of bismuth 2-ethylbutyrate in isoamyl acetate was used as the bismuth material, a 10% by weight $Bi_2SrTa_2O_9$ composition for formation of thin-film patterns was prepared, exposed to light and developed, and the results of patterning are evaluated in TABLE 32 as being satisfactory (o) or unsatisfactory (x).

TABLE 32

| Amount of 2-nitrobenz-aldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 33

In the same manner as in Example 29, except that a solution of bismuth nitrate in 2-methoxyethanol was used as the bismuth material, a 10% by weight $Bi_2SrTa_2O_9$ composition for formation of thin-film patterns was prepared, exposed to light and developed, and the results of patterning are evaluated in TABLE 33 as being satisfactory (o) or unsatisfactory (x).

TABLE 33

| Amount of 2-nitrobenz-aldehyde added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

EXAMPLE 34

In the same manner as in Example 29, except that the bismuth material was replaced by a solution of bismuth sulfate in 2-methoxyethanol, a 10% by weight $Bi_2SrTa_2O_9$ composition for formation of thin-film patterns was prepared, exposed to light and developed, and the results of patterning are evaluated in TABLE 34 as being satisfactory (o) or unsatisfactory (x).

TABLE 34

| Amount of 2-nitrobenz-aldehyde added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

TABLES 23 through 34 clearly show that the formation of the composite alkoxides of the metal alkoxides and the subsequent formation of the complexes thereof by addition of the nitro compounds produce better results.

EXAMPLE 35

A 11.65-g portion of lead acetate trihydrate was added to 75 g of 2-methoxyethanol, and the resulting mixture was heated to dissolution for dehydration as an azeotropic mixture thereby providing a solution of anhydrous lead acetate. To this solution there were added 6.12 g of zirconlure tetra-n-butoxide, 4.19 g of titanium tetra-isopropoxide and 2-methoxyethanol in an amount required to adjust the total weight of the mixture to 100 g thereby providing a 10% by weight solution of $PbZr_{0.52}Ti_{0.48}O_3$ (PZT), and β-nitrostyrol was added thereto in each of the proportions indicated in TABLE 35 to provide compositions for formation of PZT thin-film patterns.

Each of the resulting compositions was applied onto a silicon substrate to a film thickness of 500 Å by spin coating, and thereafter the coating film was irradiated with ultraviolet rays having the amount of energy indicated in TABLE 35 through a photomask and was then immersed in a 1:2 (volumetric ratio) mixed solvent of 2-methoxyethanol and isopropyl alcohol for 10 seconds for development. The results of patterning are evaluated in TABLE 35 as being satisfactory (o) or unsatisfactory (x).

TABLE 35

| Amount of β-nitrostyrol added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 36

A 32.9-g portion of a 5% by weight Ba solution prepared with barium octylate and isoamyl acetate, 21.03 g of a 5% by weight Sr solution prepared with strontium octylate and isoamyl acetate and 6.82 g of titanium tetra-isopropoxide were mixed, and the total weight of the resulting mixture was increased to 100 g by addition of isoamyl acetate thereto to prepare a 5% by weight solution of $Ba_{0.5}Sr_{0.5}TiO_3$ (BST) to which β-nitrostyrol was added in each of the proportions indicated in TABLE 36 to provide compositions for formation of BST thin-film patterns.

The resulting compositions were subjected to exposure to light and development in the same manner as in Example 35; the results of patterning are evaluated in TABLE 36 as being satisfactory (o) or unsatisfactory (x).

TABLE 36

| Amount of β-nitrostyrol added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 37

A 8.68-g portion of a 5% by weight Sr solution prepared with strontium octylate and isoamyl acetate, 41.21 g of a 5% by weight Bi solution prepared with bismuth octylate and isoamyl acetate and 4.02 g of tantalum pentaethoxide were mixed, and the total weight of the resulting mixture was increased to 100 g by addition of a 1:1 (volumetric ratio) mixed solvent of isoamyl acetate and 2-methoxyethanol thereto to prepare a 5% by weight solution of $SrBi_2Ta_2O_9$ to which β-nitrostyrol was added in each of the proportions indicated in TABLE 37 to provide compositions for formation of $SrBi_2Ta_2O_9$ thin-film patterns.

The resulting compositions were subjected to exposure to light and development in the same manner as in Example 35; the results of patterning are evaluated in TABLE 37 as being satisfactory (o) or unsatisfactory (x).

TABLE 37

| Amount of β-nitrostyrol added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 38

A 1.76-g portion of lithium ethoxide, 10.76 g of niobium pentaethoxide and 87.48 g of 2-methoxyethanol were mixed to prepare a 5% by weight LiNbO$_3$ solution to which β-nitrostyrol was added in each of the proportions indicated in TABLE 38 to provide compositions for formation of LiNbO$_3$ thin-film patterns.

The resulting compositions were subjected to exposure to light and development in the same manner as in Example 35; the results of patterning are evaluated in TABLE 38 as being satisfactory (o) or unsatisfactory (x).

TABLE 38

| Amount of β-nitrostyrol added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 39

A 71.26-g portion of a 5% by weight Bi solution prepared with bismuth octylate and isoamyl acetate and 3.65 g of titanium tetra-isopropoxide were mixed, and the total weight of the resulting mixture was increased to 100 g by addition of a 1:1 (volumetric ratio) mixed solvent of isoamyl acetate and 2-methoxyethanol thereto to prepare a 5% by weight Bi$_4$Ti$_3$O$_{12}$ solution to which β-nitrostyrol was added in each of the proportions indicated in TABLE 39 to provide compositions for formation of Bi$_4$Ti$_3$O$_{12}$ thin-film patterns.

The resulting compositions were subjected to exposure to light and development in the same manner as in Example 35; the results of patterning are evaluated in TABLE 39 as being satisfactory (o) or unsatisfactory (x).

TABLE 39

| Amount of β-nitrostyrol added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 40

In the same manner as in Example 35, except that o-nitroacetophenone was used in each of the proportions indicated in TABLE 40 instead of the β-nitrostyrol, compositions for formation of PZT thin films were obtained and then subjected to exposure to light and development; the results of patterning are evaluated in TABLE 40 as being satisfactory (o) or unsatisfactory (x).

TABLE 40

| Amount of o-nitro-acetophenone added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 41

In the same manner as in Example 36, except that o-nitroacetophenone was used in each of the proportions indicated in TABLE 41 instead of the β-nitrostyrol, compositions for formation of BST thin films were obtained and then subjected to exposure to light and development; the results of patterning are evaluated in TABLE 41 as being satisfactory (o) or unsatisfactory (x).

TABLE 41

| Amount of o-nitro-acetophenone added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 42

In the same manner as in Example 37, except that o-nitroacetophenone was used in each of the proportions indicated in TABLE 42 instead of the β-nitrostyrol, compositions for formation of SrBi$_2$Ta$_2$O$_9$ thin films were obtained and then subjected to exposure to light and development; the results of patterning are evaluated in TABLE 42 as being satisfactory (o) or unsatisfactory (x).

TABLE 42

| Amount of o-nitro-acetophenone added | Amount of light radiation energy (J/cm$^2$) | | | | | |
|---|---|---|---|---|---|---|
| (molar ratio to alkoxide) | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 43

In the same manner as in Example 38, except that o-nitroacetophenone was used in each of the proportions indicated in TABLE 43 instead of the β-nitrostyrol, compositions for formation of LiNbO$_3$ thin films were obtained and then subjected to exposure to light and development; the results of patterning are evaluated in TABLE 43 as being satisfactory (o) or unsatisfactory (x).

TABLE 43

| Amount of o-nitro-acetophenone added | Amount of light radiation energy (J/cm$^2$) | | | | | |
|---|---|---|---|---|---|---|
| (molar ratio to alkoxide) | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 44

In the same manner as in Example 39, except that o-nitroacetophenone was used in each of the proportions indicated in TABLE 44 instead of the β-nitrostyrol, compositions for formation of Bi$_4$Ti$_3$O$_{12}$ thin films were obtained and then subjected to exposure to light and development; the results of patterning are evaluated in TABLE 44 as being satisfactory (o) or unsatisfactory (x).

TABLE 44

| Amount of o-nitro-acetophenone added | Amount of light radiation energy (J/cm$^2$) | | | | | |
|---|---|---|---|---|---|---|
| (molar ratio to alkoxide) | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 45

In the same manner as in Example 35, except that o-nitroanisole was used in each of the proportions indicated in TABLE 45 instead of the β-nitrostyrol, compositions for formation of PZT thin films were obtained and then subjected to exposure to light and development; the results of patterning are evaluated in TABLE 45 as being satisfactory (o) or unsatisfactory (x).

TABLE 45

| Amount of 2-nitro-anisole added | Amount of light radiation energy (J/cm$^2$) | | | | | |
|---|---|---|---|---|---|---|
| (molar ratio to alkoxide) | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 46

In the same manner as in Example 36, except that o-nitroanisole was used in each of the proportions indicated in TABLE 46 instead of the β-nitrostyrol, compositions for formation of BST thin films were obtained and then subjected to exposure to light and development; the results of patterning are evaluated in TABLE 46 as being satisfactory (o) or unsatisfactory (x).

TABLE 46

| Amount of o-nitro-anisole added | Amount of light radiation energy (J/cm$^2$) | | | | | |
|---|---|---|---|---|---|---|
| (molar ratio to alkoxide) | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 47

In the same manner as in Example 37, except that o-nitroanisole was used in each of the proportions indicated in TABLE 47 instead of the β-nitrostyrol, compositions for formation of SrBi$_2$Ta$_2$O$_9$ thin films were obtained and then subjected to exposure to light Bad development; the results of patterning are evaluated in TABLE 47 as being satisfactory (o) or unsatisfactory (x).

TABLE 47

| Amount of o-nitro-anisole added | Amount of light radiation energy (J/cm$^2$) | | | | | |
|---|---|---|---|---|---|---|
| (molar ratio to alkoxide) | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 48

In the same manner as in Example 38, except that o-nitroanisole was used in each of the proportions indicated in TABLE 48 instead of the β-nitrostyrol, compositions for formation of LiNbO₃ thin films were obtained and then subjected to exposure to light and development; the results of patterning are evaluated in TABLE 48 as being satisfactory (o) or unsatisfactory (x).

TABLE 48

| Amount of o-nitro-anisole added | Amount of light radiation energy (J/cm$^2$) | | | | | |
|---|---|---|---|---|---|---|
| (molar ratio to alkoxide) | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 49

In the same manner as in Example 39, except that o-nitroanisole was used in each of the proportions indicated in TABLE 49 instead of the β-nitrostyrol, compositions for formation of Bi₄Ti₃O₁₂ thin films were obtained and then subjected to exposure to light and development; the results of patterning are evaluated in TABLE 49 as being satisfactory (o) or unsatisfactory (x).

TABLE 49

| Amount of o-nitro-anisole added | Amount of light radiation energy (J/cm$^2$) | | | | | |
|---|---|---|---|---|---|---|
| (molar ratio to alkoxide) | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

TABLE 35 through TABLE 49 clearly show that the addition of the nitrostyrol derivative, the nitroacetophenone derivative and/or the nitroanisole derivative in given proportions allows remarkable reduction in the amount of radiation energy required for exposure to light.

EXAMPLE 50

In the same manner as in Example 35, except that an equimolar amount of β-nitrostyrol relative to the metal alkoxide was added, and a 1.5-fold molar amount of each of the stabilizers indicated in TABLE 50 relative to the metal alkoxide was then added, there were prepared compositions for formation of PZT thin-film patterns.

Each of the resulting compositions was applied onto a silicon substrate to a film thickness of 500 Å by spin coating. The coating film was irradiated with 2 J/cm² of ultraviolet rays through a photomask and was then allowed to stand in a constant-temperature, constant-humidity room at room temperature (25° C.) and at a humidity of 70% for each of the times indicated in TABLE 50; thereafter each coating film was immersed in a 1:2 (volumetric ratio) mixed solvent of 2-methoxyethanol and isopropyl alcohol for 10 seconds for development, and the time stability was determined on the basis of the state of patterning, with the results shown in TABLE 50. In TABLE 50, "O" indicates successful patterning, and "x" indicates unsuccessful patterning due to insolubilization of the non-light-irradiated portion by hydrolysis by the moisture in the air.

TABLE 50

| Stabilizer | Standing time (min.) | | | | | |
|---|---|---|---|---|---|---|
| | 0 | 10 | 30 | 60 | 120 | 300 |
| Not added | O | O | X | X | X | X |
| Acetylacetone | O | O | O | O | O | O |
| Ethyl 3-oxobutanoate | O | O | O | O | O | X |
| 2-Ethylhexanoic acid | O | O | O | O | O | O |
| 2-Ethylbutyric acid | O | O | O | O | O | O |
| Ethanolamine | O | O | O | O | O | O |

EXAMPLE 51

In the same manner as in Example 36, except that an equimolar amount of o-nitroacetophenone relative to the metal alkoxide was added instead of the β-nitrostyrol, and a 1.5-fold molar amount of each of the stabilizers indicated in TABLE 51 relative to the metal alkoxide was added, there were prepared compositions for formation of BST thin-film patterns.

In the same manner as in Example 50, each of the resulting compositions was applied, irradiated with light, allowed to stand and developed, and then the time stability was determined, with the results shown in TABLE 51.

TABLE 51

| Stabilizer | Standing time (min.) | | | | | |
|---|---|---|---|---|---|---|
| | 0 | 10 | 30 | 60 | 120 | 300 |
| Not added | O | O | X | X | X | X |
| Acetylacetone | O | O | O | O | O | O |
| Ethyl 3-oxobutanoate | O | O | O | O | O | X |
| 2-Ethylhexanoic acid | O | O | O | O | O | O |
| 2-Ethylbutyric acid | O | O | O | O | O | O |
| Ethanolamine | O | O | O | O | O | O |

EXAMPLE 52

In the same manner as in Example 35, except that an equimolar amount of o-nitroanisole relative to the metal alkoxide was added instead of the β-nitrostyrol, and a 1.5-fold molar amount of each of the stabilizers indicated in TABLE 52 relative to the metal alkoxide was then added, there were prepared compositions for formation of PZT thin-film patterns.

In the same manner as in Example 50, each of the resulting compositions was applied, irradiated with light, allowed to stand and developed, and then the time stability was determined, with the results shown in TABLE 52.

TABLE 52

| Stabilizer | Standing time (min.) | | | | | |
|---|---|---|---|---|---|---|
| | 0 | 10 | 30 | 60 | 120 | 300 |
| Not added | O | O | X | X | X | X |
| Acetylacetone | O | O | O | O | O | O |
| Ethyl 3-oxobutanoate | O | O | O | O | O | X |
| 2-Ethylhexanoic acid | O | O | O | O | O | O |

TABLE 52-continued

| Stabilizer | Standing time (min.) | | | | | |
|---|---|---|---|---|---|---|
| | 0 | 10 | 30 | 60 | 120 | 300 |
| 2-Ethylbutyric acid | O | O | O | O | O | O |
| Ethanolamine | O | O | O | O | O | O |

EXAMPLE 53

A 32.96-g portion of a 5% by weight solution of barium 2-methoxyethoxide in terms of Ba which has been prepared by dissolving metal Ba in 2-methoxyethanol, 21.03 g of a 5% by weight solution of strontium 2-methoxyethoxide in terms of strontium which has been prepared by dissolving metal Sr in 2-methoxyethanol and 6.82 g of titanium tetra-isopropoxide were mixed, and the total weight of the mixture was adjusted to 100 g by addition of 2-methoxyethanol thereto to prepare a 5% by weight solution of $Ba_{0.5}Sr_{0.5}TiO_3$ (BST) to which an equimolar amount of β-nitrostyrol relative to the metal alkoxide was added and further a 1.5-fold molar amount of each of the stabilizers indicated in TABLE 53 relative to the metal alkoxide was added to prepare compositions for formation of BST thin-film patterns.

In the same manner as in Example 50, each of the resulting compositions was applied, irradiated with light, allowed to stand and developed, and then the time stability was determined, with the results shown in TABLE 53.

TABLE 53

| Stabilizer | Standing time (min.) | | | | | |
|---|---|---|---|---|---|---|
| | 0 | 10 | 30 | 60 | 120 | 300 |
| Not added | O | O | X | X | X | X |
| Acetylacetone | O | O | O | O | O | O |
| Ethyl 3-oxobutanoate | O | O | O | O | O | X |
| 2-Ethylhexanoic acid | O | O | O | O | O | O |
| 2-Ethylbutyric acid | O | O | O | O | O | O |
| Ethanolamine | O | O | O | O | O | O |

EXAMPLE 54

A 12.28-g portion of tin tetra-t-butoxide $Sn(O-t-Bu)_4$ and 1.05 g of antimony tributoxide $Sb(OBu)_3$ were dissolved in 86.67 g of 2-methoxyethanol to prepare a 5% by weight ATO solution. To this solution there were added a 2-fold molar amount of o-nitroacetophenone relative to the metal alkoxide (the total of the molar numbers of Sn and Sb) and then a 1.5-fold molar amount of each of the stabilizers indicated in TABLE 54 relative to the metal alkoxide to prepare compositions for formation of ATO thin-film patterns.

In the same manner as in Example 50, each of the resulting compositions was applied, irradiated with light, allowed to stand and developed, and then the time stability was determined, with the results shown in TABLE 54.

TABLE 54

| Stabilizer | Standing time (min.) | | | | | |
|---|---|---|---|---|---|---|
| | 0 | 10 | 30 | 60 | 120 | 300 |
| Not added | O | O | X | X | X | X |
| Acetylacetone | O | O | O | O | O | O |
| Ethyl 3-oxobutanoate | O | O | O | O | O | X |

TABLE 54-continued

| Stabilizer | Standing time (min.) | | | | | |
|---|---|---|---|---|---|---|
| | 0 | 10 | 30 | 60 | 120 | 300 |
| 2-Ethylhexanoic acid | O | O | O | O | O | O |
| 2-Ethylbutyric acid | O | O | O | O | O | O |
| Ethanolamine | O | O | O | O | O | O |

TABLES 50 through 54 clearly show that the addition of the stabilizers results in improvement in the time stability of the compositions for formation of thin-film patterns of a metal oxide in a high-humidity environment.

EXAMPLE 55

Each of the metal alkoxides indicated in TABLE 55 was dissolved in 2-methoxyethanol, and β-nitrostyrol was added to the resulting solution in each of the amounts (molar ratios) indicated in TABLE 55, and the mixture was heated to reflux for 5 hours to form a complex of the metal alkoxide and the β-nitrostyrol. Each of the resulting solutions was applied onto a silicon substrate to a film thickness of 500 Å by spin coating. Each coating film was irradiated with 0.1 J/cm² of ultraviolet rays through a photomask, and then immersed in a 1:2 (volumetric ratio) mixed solvent of 2-methoxyethanol and isopropyl alcohol for 10 seconds for development. The results of patterning are evaluated in TABLE 55 as being satisfactory (o) or unsatisfactory (x).

TABLE 55

| Metal alkoxide | Amount of β-nitrostyrol added (molar ratio to alkoxide) | Result of patterning |
|---|---|---|
| Lead diisopropoxide $Pb(O-i-Pr)_2$ | 0.5<br>1<br>2 | O<br>O<br>O |
| Zirconium tetra-n-butoxide $Zr(O-n-Bu)_4$ | 0.5<br>2<br>4 | O<br>O<br>O |
| Titanium tetra-isopropoxide $Ti(O-i-Pr)_4$ | 0.5<br>2<br>4 | O<br>O<br>O |
| Barium diisopropoxide $Ba(O-i-Pr)_2$ | 0.5<br>1<br>2 | O<br>O<br>O |
| Strontium diisopropoxide $Sr(O-i-Pr)_2$ | 0.5<br>1<br>2 | O<br>O<br>O |
| Bismuth tri-t-pentoxide $Bi(O-t-Pe)_3$ | 0.5<br>2<br>3 | O<br>O<br>O |
| Tantalum pentaethoxide $Ta(OEt)_5$ | 1<br>3<br>5 | O<br>O<br>O |
| Niobium pentaethoxide $Nb(OEt)_5$ | 1<br>3<br>5 | O<br>O<br>O |

EXAMPLE 56

In the same manner as in Example 55, except that o-nitroacetophenone was used instead of the β-nitrostyrol, complexes were formed, applied, irradiated with light and developed, and the results of patterning are evaluated in TABLE 56 as being satisfactory (o) or unsatisfactory (x).

TABLE 56

| Metal alkoxide | Amount of o-nitroaceto-phenone added (molar ratio to alkoxide) | Result of patterning |
|---|---|---|
| Lead | 0.5 | o |
| diisopropoxide | 1 | o |
| Pb(O-i-Pr)$_2$ | 2 | o |
| Zirconium | 0.5 | o |
| tetra-n- | 2 | o |
| butoxide | 4 | o |
| Zr(O-n-Bu)$_4$ | | |
| Titanium tetra- | 0.5 | o |
| isopropoxide | 2 | o |
| Ti(O-i-Pr)$_4$ | 4 | o |
| Barium | 0.5 | o |
| diisopropoxide | 1 | o |
| Ba(O-i-Pr)$_2$ | 2 | o |
| Strontium | 0.5 | o |
| diisopropoxide | 1 | o |
| Sr(O-i-Pr)$_2$ | 2 | o |
| Bismuth tri-t- | 0.5 | o |
| pentoxide | 2 | o |
| Bi(O-t-Pe)$_3$ | 3 | o |
| Tantalum | 1 | o |
| pentaethoxide | 3 | o |
| Ta(OEt)$_5$ | 5 | o |
| Niobium | 1 | o |
| pentaethoxide | 3 | o |
| Nb(OEt)$_5$ | 5 | o |

EXAMPLE 57

In the same manner as in Example 55, except that o-nitroanisole was used instead of the β-nitrostyrol, complexes were formed, applied, irradiated with light and developed, and the results of patterning are evaluated in TABLE 57 as being satisfactory (o) or unsatisfactory (x).

TABLE 57

| Metal alkoxide | Amount of o-nitroanisole added (molar ratio to alkoxide) | Result of patterning |
|---|---|---|
| Lead | 0.5 | o |
| diisopropoxide | 1 | o |
| Pb(O-i-Pr)$_2$ | 2 | o |
| Zirconium | 0.5 | o |
| tetra-n- | 2 | o |
| butoxide | 4 | o |
| Zr(O-n-Bu)$_4$ | | |
| Titanium tetra- | 0.5 | o |
| isopropoxide | 2 | o |
| Ti(O-i-Pr)$_4$ | 4 | o |
| Barium | 0.5 | o |
| diisopropoxide | 1 | o |
| Ba(O-i-Pr)$_2$ | 2 | o |
| Strontium | 0.5 | o |
| diisopropoxide | 1 | o |
| Sr(O-i-Pr)$_2$ | 2 | o |
| Bismuth tri-t- | 0.5 | o |
| pentoxide | 2 | o |
| Bi(O-t-Pe)$_3$ | 3 | o |
| Tantalum | 1 | o |
| pentaethoxide | 3 | o |
| Ta(OEt)$_5$ | 5 | o |
| Niobium | 1 | o |
| pentaethoxide | 3 | o |
| Nb(OEt)$_5$ | 5 | o |

TABLES 55 through 57 clearly show that formation of the complexes of the metal alkoxides and the nitro compounds allows patterning upon exposure to low-energy light even in cases where a small amount of each of the nitro compounds is added.

EXAMPLE 58

To form complexes, β-nitrostyrol in each of the proportions indicated in TABLE 58 was added to a composite alkoxide of Bi$_2$SrTa$_2$ formed by heating to reflux a mixture of 9.3 g of bismuth t-pentoxide, 8.71 g of tantalum ethoxide and 8.03 g of a 9.95% by weight solution of strontium in 2-methoxyethanol, and 2.3 g of 2-ethylbutyric acid was added to each of the complexes to prevent the highly hydrolyric action of the remaining functional groups of the composite alkoxide thereby stabilizing the solution, and finally the weight of the mixture was adjusted by addition of 2-methoxyethanol thereto to prepare 100 g of a 10% by weight Bi$_2$SrTa$_2$O$_9$ composition for formation of thin-film patterns.

Each of the resulting compositions was applied onto a silicon substrate to a film thickness of 800 Å by spin coating, and thereafter the coating film was irradiated with ultraviolet rays having the amount of energy indicated in TABLE 58 through a photomask and was then immersed in isopropyl alcohol used as the solvent for 10 seconds for development. The results of patterning are evaluated in TABLE 58 as being satisfactory (o) or unsatisfactory (x).

TABLE 58

| Amount of β-nitrostyrol added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

EXAMPLE 59

In the same manner as in Example 58, except that o-nitroanisole was used in each of the proportions indicated in TABLE 59 instead of the β-nitrostyrol, a 10% by weight Bi$_2$SrTa$_2$O$_9$ composition for formation of thin-film patterns was prepared, exposed to light and developed, and the results of patterning are evaluated in TABLE 59 as being satisfactory (o) or unsatisfactory (x).

TABLE 59

| Amount of β-nitro-anisole added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

EXAMPLE 60

To form complexes, β-nitrostyrol in each of the proportions indicated in TABLE 60 was added to 100 g of a 15% by weight solution of a composite alkoxide of SrTa$_2$ formed by heating to reflux a mixture of 27.1 g of tantalum ethoxide and 29.4 g of a 9.95% by weight solution of strontium in 2-methoxyethanol and dissolving the mixture in 2-methoxyethanol, and 7.8 g of 2-ethylbutyric acid was added to each of the complexes to prevent the highly hydrolytic action of the remaining functional groups of the composite alkoxide thereby stabilizing the solution, and after addition of a 9.63% by weight solution of bismuth 2-ethylhexanoate in isoamyl acetate to the solution, the solution was finally adjusted by addition of 2-methoxyethanol thereto to prepare a 10% by weight $Bi_2SrTa_2O_9$ composition for formation of thin-film patterns.

The resulting compositions were exposed to light and developed in the same manner as in Example 58, with the results shown in TABLE 60 wherein the patterning is evaluated to be satisfactory (o) or unsatisfactory (x).

TABLE 60

| Amount of β-nitrostyrol added | Amount of light radiation energy (J/cm$^2$) | | | | | |
|---|---|---|---|---|---|---|
| (molar ratio to alkoxide) | 0.5 | 1 | 3 | 5 | 8 | 10 |
| 0 | X | X | X | X | X | O |
| 0.02 | X | X | O | O | O | O |
| 0.05 | X | O | O | O | O | O |
| 0.1 | O | O | O | O | O | O |
| 1 | O | O | O | O | O | O |
| 2 | O | O | O | O | O | O |
| 4 | O | O | O | O | O | O |

EXAMPLE 61

In the same manner as in Example 60, except that o-nitroanisole in each of the proportions indicated in TABLE 61 was added instead of the β-nitrostyrol, a 10% by weight $Bi_2SrTa_2O_9$ composition for formation of thin-film patterns was prepared, exposed to light and developed, and the results of patterning are evaluated in TABLE 61 as being satisfactory (o) or unsatisfactory (x).

TABLE 61

| Amount of β-nitro-anisole added (molar | Amount of light radiation energy (J/cm$^2$) | | | | | |
|---|---|---|---|---|---|---|
| ratio to alkoxide) | 0.5 | 1 | 3 | 5 | 8 | 10 |
| 0 | X | X | X | X | X | O |
| 0.02 | X | X | O | O | O | O |
| 0.05 | X | O | O | O | O | O |
| 0.1 | O | O | O | O | O | O |
| 1 | O | O | O | O | O | O |
| 2 | O | O | O | O | O | O |
| 4 | O | O | O | O | O | O |

EXAMPLE 62

In the same manner as in Example 58, except that the bismuth material was replaced by a solution of bismuth nitrate in 2-methoxyethanol, a 10% by weight $Bi_2SrTa_2O_9$ composition for formation of thin-film patterns was prepared, exposed to light and developed, and the results of patterning are evaluated in TABLE 62 as being satisfactory (o) or unsatisfactory (x).

TABLE 62

| Amount of β-nitro-styrol added (molar | Amount of light radiation energy (J/cm$^2$) | | | | | |
|---|---|---|---|---|---|---|
| ratio to alkoxide) | 0.5 | 1 | 3 | 5 | 8 | 10 |
| 0 | X | X | X | X | X | O |
| 0.02 | X | X | O | O | O | O |
| 0.05 | X | O | O | O | O | O |
| 0.1 | O | O | O | O | O | O |
| 1 | O | O | O | O | O | O |
| 2 | O | O | O | O | O | O |
| 4 | O | O | O | O | O | O |

TABLES 58 through 62 clearly show that the formation of the composite alkoxides of the metal alkoxides and the subsequent formation of the complexes thereof by addition of the nitro compounds thereto produce better results.

EXAMPLE 63

A 11.65-g portion of lead acetate trihydrate was added to 75 g of 2-methoxyethanol, and the resulting mixture was heated to dissolution for dehydration as an azeotropic mixture thereby providing a solution of anhydrous lead acetate. To this solution there were added 6.12 g of zirconlure tetra-n-butoxide, 4.19 g of titanium tetra-isopropoxide and 2-methoxyethanol in an amount required to adjust the total weight of the mixture to 100 g thereby providing a 10% by weight solution of $PbZr_{0.52}Ti_{0.49}O_3$ (PZT), and 2-nitrofuran was added thereto in each of the proportions indicated in TABLE 63 to provide compositions for formation of PZT thin-film patterns.

Each of the resulting compositions was applied onto a silicon substrate to a film thickness of 500 Å by spin coating, and thereafter the coating film was irradiated with ultraviolet rays having the amount of energy indicate in TABLE 63 through a photomask and was then immersed in 1:2 (volumetric ratio) mixed solvent of 2-methoxyethanol and isopropyl alcohol for 10 seconds for development. The results of patterning are evaluated in TABLE 63 as being satisfactory (o) or unsatisfactory (x).

TABLE 63

| Amount of 2-nitrofuran added (molar | Amount of light radiation energy (J/cm$^2$) | | | | | |
|---|---|---|---|---|---|---|
| ratio to alkoxide) | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 64

A 32.9-g portion of a 5% by weight Ba solution prepared with barium octylate and isoamyl acetate, 21.03 g of a 5% by weight Sr solution prepared with strontium octylate and isoamyl acetate and 6.82 g of titanium tetra-isopropoxide were mixed, and the total weight of the resulting mixture was increased to 100 g by addition of isoamyl acetate thereto to prepare a 5% by weight solution of $Ba_{0.5}Sr_{0.5}TiO_3$ (BST) to which 2-nitrofuran was added in each of the proportions indicated in TABLE 64 to provide compositions for formation of BST thin-film patterns.

The resulting compositions were subjected to exposure to light and development in the same manner as in Example 63; the results of patterning are evaluated in TABLE 64 as being satisfactory (o) or unsatisfactory (x).

TABLE 64

| Amount of 2-nitrofuran added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 65

A 8.68-g portion of a 5% by weight Sr solution prepared with strontium octylate and isoamyl acetate, 41.21 g of a 5% by weight Bi solution prepared with bismuth octylate and isoamyl acetate and 4.02 g of tantalum pentaethoxide were mixed, and the total weight of the resulting mixture was increased to 100 g by addition of a 1:1 (volumetric ratio) mixed solvent of isoamyl acetate and 2-methoxyethanol thereto to prepare a 5% by weight solution of $SrBi_2Ta_2O_9$ to which 2-nitrofuran was added in each of the proportions indicated in TABLE 65 to provide compositions for formation of $SrBi_2Ta_2O_9$ thin-film patterns.

The resulting compositions were subjected to exposure to light and development in the same manner as in Example 63; the results of patterning are evaluated in TABLE 65 as being satisfactory (o) or unsatisfactory (x).

TABLE 65

| Amount of 2-nitrofuran added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 66

A 1.76-g portion of lithium ethoxide, 10.76 g of niobium pentaethoxide and 87.48 g of 2-methoxyethanol were mixed to prepare a 5% by weight solution of $LiNbO_3$ to which 2-nitrofuran was added in each of the proportions indicated in TABLE 66 to provide compositions for formation of $LiNbO_3$ thin-film patterns.

The resulting compositions were subjected to exposure to light and development in the same manner as in Example 63; the results of patterning are evaluated in TABLE 66 as being satisfactory (o) or unsatisfactory (x).

TABLE 66

| Amount of 2-nitrofuran added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 67

A 71.26-g portion of a 5% by weight Bi solution prepared with bismuth octylate and isoamyl acetate and 3.65 g of titanium tetra-isopropoxide were mixed, and the total weight of the resulting mixture was increased to 100 g by addition of a 1:1 (volumetric ratio) mixed solvent of isoamyl acetate and 2-methoxyethanol thereto to prepare a 5% by weight solution of $Bi_4Ti_3O_{12}$ to which 2-nitrofuran was added in each of the proportions indicated in TABLE 67 to provide compositions for formation of $Bi_4Ti_3O_{12}$ thin-film patterns.

The resulting compositions were subjected to exposure to light and development in the same manner as in Example 63; the results of patterning are evaluated in TABLE 67 as being satisfactory (o) or unsatisfactory (x).

TABLE 67

| Amount of 2-nitrofuran added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 68

In the same manner as in Example 63, except that anti-5-nitro-2-furaldoxime was used in each of the proportions indicated in TABLE 68 instead of the 2-nitrofuran, compositions for formation of PZT thin films were obtained and then subjected to exposure to light and development; the results of patterning are evaluated in TABLE 68 as being satisfactory (o) or unsatisfactory (x).

TABLE 68

| Amount of anti-5-nitro-2-furaldoxime added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |

TABLE 68-continued

| Amount of anti-5-nitro-2-furaldoxime added (molar ratio to alkoxide) | Amount of light radiation energy (J/cm$^2$) | | | | | |
|---|---|---|---|---|---|---|
| | 0.5 | 1 | 3 | 5 | 8 | 10 |
| 1 | ○ | ○ | ○ | ○ | ○ | ○ |
| 2 | ○ | ○ | ○ | ○ | ○ | ○ |
| 4 | ○ | ○ | ○ | ○ | ○ | ○ |

EXAMPLE 69

In the same manner as in Example 64, except that anti-5-nitro-2-furaldoxime was used in each of the proportions indicated in TABLE 69 instead of the 2-nitrofuran, compositions for formation of BST thin films were obtained and then subjected to exposure to light and development; the results of patterning are evaluated in TABLE 69 as being satisfactory (o) or unsatisfactory (x).

TABLE 69

| Amount of anti-5-nitro-2-furaldoxime added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | X | X | X | X | X | ○ |
| 0.02 | X | X | X | X | X | ○ |
| 0.05 | X | X | ○ | ○ | ○ | ○ |
| 0.1 | X | ○ | ○ | ○ | ○ | ○ |
| 1 | ○ | ○ | ○ | ○ | ○ | ○ |
| 2 | ○ | ○ | ○ | ○ | ○ | ○ |
| 4 | ○ | ○ | ○ | ○ | ○ | ○ |

EXAMPLE 70

In the same manner as in Example 65, except that anti-5-nitro-2-furaldoxime was used in each of the proportions indicated in TABLE 70 instead of the 2-nitrofuran, compositions for formation of SrBi$_2$Ta$_2$O$_9$ thin films were obtained and then subjected to exposure to light and development; the results of patterning are evaluated in TABLE 70 as being satisfactory (o) or unsatisfactory (x).

TABLE 70

| Amount of anti-5-nitro-2-furaldoxime added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | X | X | X | X | X | ○ |
| 0.02 | X | X | X | X | X | ○ |
| 0.05 | X | X | ○ | ○ | ○ | ○ |
| 0.1 | X | ○ | ○ | ○ | ○ | ○ |
| 1 | ○ | ○ | ○ | ○ | ○ | ○ |
| 2 | ○ | ○ | ○ | ○ | ○ | ○ |
| 4 | ○ | ○ | ○ | ○ | ○ | ○ |

EXAMPLE 71

In the same manner as in Example 66, except that anti-5-nitro-2-furaldoxime was used in each of the proportions indicated in TABLE 71 instead of the 2-nitrofuran, compositions for foundation of LiNbO$_3$ thin films were obtained and then subjected to exposure to light and development; the results of patterning are evaluated in TABLE 71 as being satisfactory (o) or unsatisfactory (x).

TABLE 71

| Amount of anti-5-nitro-2-furaldoxime added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | X | X | X | X | X | ○ |
| 0.02 | X | X | X | X | X | ○ |
| 0.05 | X | X | ○ | ○ | ○ | ○ |
| 0.1 | X | ○ | ○ | ○ | ○ | ○ |
| 1 | ○ | ○ | ○ | ○ | ○ | ○ |
| 2 | ○ | ○ | ○ | ○ | ○ | ○ |
| 4 | ○ | ○ | ○ | ○ | ○ | ○ |

EXAMPLE 72

In the same manner as in Example 67, except that anti-5-nitro-2-furaldoxime was used in each of the proportions indicated in TABLE 72 instead of the 2-nitrofuran, compositions for formation of Bi$_4$Ti$_3$O$_{12}$ thin films were obtained and then subjected to exposure to light and development; the results of patterning are evaluated in TABLE 72 as being satisfactory (o) or unsatisfactory (x).

TABLE 72

| Amount of anti-5-nitro-2-furaldoxime added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | X | X | X | X | X | ○ |
| 0.02 | X | X | X | X | X | ○ |
| 0.05 | X | X | ○ | ○ | ○ | ○ |
| 0.1 | X | ○ | ○ | ○ | ○ | ○ |
| 1 | ○ | ○ | ○ | ○ | ○ | ○ |
| 2 | ○ | ○ | ○ | ○ | ○ | ○ |
| 4 | ○ | ○ | ○ | ○ | ○ | ○ |

EXAMPLE 73

In the same manner as in Example 63, except that 5-nitro-2-furoic acid was used in each of the proportions indicated in TABLE 73 instead of the 2-nitrofuran, compositions for formation of PZT thin films were obtained and then subjected to exposure to light and development; the results of patterning are evaluated in TABLE 73 as being satisfactory (o) or unsatisfactory (x).

TABLE 73

| Amount of 5-nitro-2-furonic acid added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | X | X | X | X | X | ○ |
| 0.02 | X | X | X | X | X | ○ |
| 0.05 | X | X | ○ | ○ | ○ | ○ |
| 0.1 | X | ○ | ○ | ○ | ○ | ○ |

TABLE 73-continued

| Amount of 5-nitro-2-furonic acid added (molar ratio to alkoxide) | Amount of light radiation energy (J/cm²) | | | | | |
|---|---|---|---|---|---|---|
| | 0.5 | 1 | 3 | 5 | 8 | 10 |
| 1 | o | o | o | o | o | o |
| 2 | o | o | o | o | o | o |
| 4 | o | o | o | o | o | o |

EXAMPLE 74

In the same manner as in Example 64, except that 5-nitro-2-furoic acid was used in each of the proportions indicated in TABLE 74 instead of the 2-nitrofuran, compositions for formation of BST thin films were obtained and then subjected to exposure to light and development; the results of patterning are evaluated in TABLE 74 as being satisfactory (o) or unsatisfactory (x).

TABLE 74

| Amount of 5-nitro-2-furoic acid added (molar ratio to alkoxide) | Amount of light radiation energy (J/cm²) | | | | | |
|---|---|---|---|---|---|---|
| | 0.5 | 1 | 3 | 5 | 8 | 10 |
| 0 | X | X | X | X | X | o |
| 0.02 | X | X | X | X | X | o |
| 0.05 | X | X | o | o | o | o |
| 0.1 | X | o | o | o | o | o |
| 1 | o | o | o | o | o | o |
| 2 | o | o | o | o | o | o |
| 4 | o | o | o | o | o | o |

EXAMPLE 75

In the same manner as in Example 65, except that 5-nitrofuroic acid was used in each of the proportions indicated in TABLE 75 instead of the 2-nitrofuran, compositions for formation of SrBi$_2$Ta$_2$O$_9$ thin films were obtained and then subjected to exposure to light and development; the results of patterning are evaluated in TABLE 75 as being satisfactory (o) or unsatisfactory (x).

TABLE 75

| Amount of 5-nitro-2-furoic acid added (molar ratio to alkoxide) | Amount of light radiation energy (J/cm²) | | | | | |
|---|---|---|---|---|---|---|
| | 0.5 | 1 | 3 | 5 | 8 | 10 |
| 0 | X | X | X | X | X | o |
| 0.02 | X | X | X | X | X | o |
| 0.05 | X | X | o | o | o | o |
| 0.1 | X | o | o | o | o | o |
| 1 | o | o | o | o | o | o |
| 2 | o | o | o | o | o | o |
| 4 | o | o | o | o | o | o |

EXAMPLE 76

In the same manner as in Example 66, except that 5-nitro-2-furoic acid was used in each of the proportions indicated in TABLE 76 instead of the 2-nitrofuran, compositions for formation of LiNbO$_3$ thin films were obtained and then subjected to exposure to light and development; the results of patterning are evaluated in TABLE 76 as being satisfactory (o) or unsatisfactory (x).

TABLE 76

| Amount of 5-nitro-2-furoic acid added (molar ratio to alkoxide) | Amount of light radiation energy (J/cm²) | | | | | |
|---|---|---|---|---|---|---|
| | 0.5 | 1 | 3 | 5 | 8 | 10 |
| 0 | X | X | X | X | X | o |
| 0.02 | X | X | X | X | X | o |
| 0.05 | X | X | o | o | o | o |
| 0.1 | X | o | o | o | o | o |
| 1 | o | o | o | o | o | o |
| 2 | o | o | o | o | o | o |
| 4 | o | o | o | o | o | o |

EXAMPLE 77

In the same manner as in Example 67, except that 5-nitro-2-furoic acid was used in each of the proportions indicated in TABLE 77 instead of the 2-nitrofuran, compositions for formation of Bi$_4$Ti$_3$O$_{12}$ thin films were obtained and then subjected to exposure to light and development; the results of patterning are evaluated in TABLE 77 as being satisfactory (o) or unsatisfactory (x).

TABLE 77

| Amount of 5-nitro-2-furoic acid added (molar ratio to alkoxide) | Amount of light radiation energy (J/cm²) | | | | | |
|---|---|---|---|---|---|---|
| | 0.5 | 1 | 3 | 5 | 8 | 10 |
| 0 | X | X | X | X | X | o |
| 0.02 | X | X | X | X | X | o |
| 0.05 | X | X | o | o | o | o |
| 0.1 | X | o | o | o | o | o |
| 1 | o | o | o | o | o | o |
| 2 | o | o | o | o | o | o |
| 4 | o | o | o | o | o | o |

EXAMPLE 78

In the same manner as in Example 63, except that 5-nitro-2-furaldehyde was used in each of the proportions indicated in TABLE 78 instead of the 2-nitrofuran, compositions for formation of PZT thin films were obtained and then subjected to exposure to light and development; the results of patterning are evaluated in TABLE 78 as being satisfactory (o) or unsatisfactory (x).

TABLE 78

| Amount of 5-nitro-2-furaldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | X | X | X | X | X | o |
| 0.02 | X | X | X | X | X | o |
| 0.05 | X | X | o | o | o | o |
| 0.1 | X | o | o | o | o | o |

TABLE 78-continued

| Amount of 5-nitro-2-furaldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 1 | O | O | O | O | O | O |
| 2 | O | O | O | O | O | O |
| 4 | O | O | O | O | O | O |

EXAMPLE 79

In the same manner as in Example 64, except that 5-nitro-2-furaldehyde was used in each of the proportions indicated in TABLE 79 instead of the 2-nitrofuran, compositions for formation of BST thin films were obtained and then subjected to exposure to light and development; the results of patterning are evaluated in TABLE 79 as being satisfactory (o) or unsatisfactory (x).

TABLE 79

| Amount of 5-nitro-2-furaldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 80

In the same manner as in Example 65, except that 5-nitro-2-furaldehyde was used in each of the proportions indicated in TABLE 80 instead of the 2-nitrofuran, compositions for formation of $SrBi_2Ta_2O_9$ thin films were obtained and then subjected to exposure to light and development; the results of patterning are evaluated in TABLE 80 as being satisfactory (o) or unsatisfactory (x).

TABLE 80

| Amount of 5-nitro-2-furaldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | X | X | X | X | X | O |
| 0.02 | X | X | X | X | X | O |
| 0.05 | X | X | O | O | O | O |
| 0.1 | X | O | O | O | O | O |
| 1 | O | O | O | O | O | O |
| 2 | O | O | O | O | O | O |
| 4 | O | O | O | O | O | O |

EXAMPLE 81

In the same manner as in Example 66, except that 5-nitro-2-furaldehyde was used in each of the proportions indicated in TABLE 81 instead of the 2-nitrofuran, compositions for formation of $LiNbO_3$ thin films were obtained and then subjected to exposure to light and development; the results of patterning are evaluated in TABLE 81 as being satisfactory (o) or unsatisfactory (x).

TABLE 81

| Amount of 5-nitro-2-furaldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

EXAMPLE 82

In the same manner as in Example 67, except that 5-nitro-2-furaldehyde was used in each of the proportions indicated in TABLE 82 instead of the 2-nitrofuran, compositions for formation of $Bi_4Ti_3O_{12}$ thin films were obtained and then subjected to exposure to light and development; the results of patterning are evaluated in TABLE 82 as being satisfactory (o) or unsatisfactory (x).

TABLE 82

| Amount of 5-nitro-2-furaldehyde added (molar ratio to alkoxide) | Amount of light radiation energy (J/cm²) | | | | | |
|---|---|---|---|---|---|---|
| | 0.5 | 1 | 3 | 5 | 8 | 10 |
| 0 | x | x | x | x | x | o |
| 0.02 | x | x | x | x | x | o |
| 0.05 | x | x | o | o | o | o |
| 0.1 | x | o | o | o | o | o |
| 1 | o | o | o | o | o | o |
| 2 | o | o | o | o | o | o |
| 4 | o | o | o | o | o | o |

TABLE 63 through TABLE 82 clearly show that the addition of the nitrofuran derivatives in the given proportions allows remarkable reduction in the amount of radiation energy required for exposure to light.

EXAMPLE 83

In the same manner as in Example 63, except that an equimolar amount of 2-nitrofuran relative to the metal alkoxide was added, and a 1.5-fold molar amount of each of the stabilizers indicated in TABLE 83 relative to the metal alkoxide was then added, there were prepared compositions for formation of PZT thin-film patterns.

Each of the resulting compositions was applied onto a silicon substrate to a film thickness of 500 Å by spin coating. The coating film was irradiated with 2 J/cm² of ultraviolet rays through a photomask and was then allowed to stand in a constant-temperature, constant-humidity room at room temperature (25° C.) and at a humidity of 70% for each of the times indicated in TABLE 83; thereafter each coating film was immersed in a 1:2 (volumetric ratio) mixed solvent of 2-methoxyethanol and isopropyl alcohol for 10 seconds for development, and the time stability was determined on the basis of the state of patterning, with the results shown in TABLE 83. In TABLE 83, "O" indicates successful patterning, and "x" indicates unsuccessful patterning due to insolubilization of the non-light-irradiated portion by hydrolysis by the moisture in the air.

TABLE 83

| Stabilizer | Standing time (min.) | | | | | |
|---|---|---|---|---|---|---|
| | 0 | 10 | 30 | 60 | 120 | 300 |
| Not added | o | o | x | x | x | x |
| Acetylacetone | o | o | o | o | o | o |
| Ethyl 3-oxobutanoate | o | o | o | o | o | x |
| 2-Ethylhexanoic acid | o | o | o | o | o | o |
| 2-Ethylbutyric acid | o | o | o | o | o | o |
| Ethanolamine | o | o | o | o | o | o |

EXAMPLE 84

In the same manner as in Example 64, except that an equimolar amount of anti-5-nitro-2-furaldoxime relative to the metal alkoxide was added instead of the 2-nitrofuran, and a 1.5-fold molar amount of each of the stabilizers indicated in TABLE 84 relative to the metal alkoxide was added, there were prepared compositions for formation of BST thin-film patterns.

In the same manner as in Example 83, each of the resulting compositions was applied, irradiated with light, allowed to stand and developed, and then the time stability was determined, with the results shown in TABLE 84.

TABLE 84

| Stabilizer | Standing time (min.) | | | | | |
|---|---|---|---|---|---|---|
| | 0 | 10 | 30 | 60 | 120 | 300 |
| Not added | o | o | x | x | x | x |
| Acetylacetone | o | o | o | o | o | o |
| Ethyl 3-oxobutanoate | o | o | o | o | o | x |
| 2-Ethylhexanoic acid | o | o | o | o | o | o |
| 2-Ethylbutyric acid | o | o | o | o | o | o |
| Ethanolamine | o | o | o | o | o | o |

EXAMPLE 85

In the same manner as in Example 63, except that an equimolar amount of 5-nitro-2-furoic acid relative to the metal alkoxide was added instead of the 2-nitrofuran, and a 1.5-fold molar amount of each of the stabilizers indicated in TABLE 85 relative to the metal alkoxide was then added, there were prepared compositions for formation of PZT thin-film patterns.

In the same manner as in Example 83, each of the resulting compositions was applied, irradiated with light, allowed to stand and developed, and then the time stability was determined, with the results shown in TABLE 85.

TABLE 85

| Stabilizer | Standing time (min.) | | | | | |
|---|---|---|---|---|---|---|
| | 0 | 10 | 30 | 60 | 120 | 300 |
| Not added | o | o | x | x | x | x |
| Acetylacetone | o | o | o | o | o | o |
| Ethyl 3-oxobutanoate | o | o | o | o | o | x |
| 2-Ethylhexanoic acid | o | o | o | o | o | o |
| 2-Ethylbutyric acid | o | o | o | o | o | o |
| Ethanolamine | o | o | o | o | o | o |

EXAMPLE 86

A 32.96-g portion of a 5% by weight Ba solution in terms of Ba which has been prepared by dissolving metal Ba in 2-methoxyethanol, 21.03 g of a 5% by weight solution of strontium 2-methoxyethoxide in terms of strontium which has been prepared by dissolving metal Sr in 2-methoxyethanol and 6.82 g of titanium tetra-isopropoxide were mixed, and the total weight of the mixture was adjusted to 100 g by addition of 2-methoxyethanol thereto to prepare a 5% by weight solution of $Ba_{0.5}Sr_{0.5}TiO_3$ (BST) to which an equimolar amount of 2-nitro-2-furaldehyde relative to the metal alkoxide was added and further a 1.5-fold molar amount of each of the stabilizers indicated in TABLE 86 relative to the metal alkoxide was added to prepare compositions for formation of BST thin-film patterns.

In the same manner as in Example 83, each of the resulting compositions was applied, irradiated with light, allowed to stand and developed, and then the time stability was determined, with the results shown in TABLE 86.

TABLE 86

| Stabilizer | Standing time (min.) | | | | | |
|---|---|---|---|---|---|---|
| | 0 | 10 | 30 | 60 | 120 | 300 |
| Not added | o | o | x | x | x | x |
| Acetylacetone | o | o | o | o | o | o |
| Ethyl 3-oxobutanoate | o | o | o | o | o | x |
| 2-Ethylhexanoic acid | o | o | o | o | o | o |
| 2-Ethylbutyric acid | o | o | o | o | o | o |
| Ethanolamine | o | o | o | o | o | o |

EXAMPLE 87

A 12.28-g portion of tin tetra-t-butoxide $Sn(O-t-Bu)_4$ and 1.05 g of antimony tributoxide $Sb(OBu)_3$ were dissolved in 86.67 g of 2-methoxyethanol to prepare a 5% by weight ATO solution. To this solution there were added a 2-fold molar amount of 2-nitro-2-furaldehyde relative to the metal alkoxide (the total of the molar numbers of Sn and Sb) and then a 1.5-fold molar amount of each of the stabilizers indicated in TABLE 87 relative to the metal alkoxide to prepare compositions for formation of ATO thin-film patterns.

In the same manner as in Example 83, each of the resulting compositions was applied, irradiated with light, allowed to stand and developed, and then the time stability was determined, with the results shown in TABLE 87.

TABLE 87

| Stabilizer | Standing time (min.) | | | | | |
|---|---|---|---|---|---|---|
| | 0 | 10 | 30 | 60 | 120 | 300 |
| Not added | o | o | x | x | x | x |
| Acetylacetone | o | o | o | o | o | o |
| Ethyl 3-oxobutanoate | o | o | o | o | o | x |
| 2-Ethylhexanoic acid | o | o | o | o | o | o |
| 2-Ethylbutyric acid | o | o | o | o | o | o |
| Ethanolamine | o | o | o | o | o | o |

TABLES 83 through 87 clearly show that the addition of the stabilizers results in improvement in the time stability of the compositions for formation of thin-film patterns of a metal oxide in a high-humidity environment.

EXAMPLE 88

Each of the metal alkoxides indicated in TABLE 88 was dissolved in 2-methoxyethanol, and 2-nitrofuran was added to the resulting solution in each of the amounts (molar ratios) indicated in TABLE 88, and the mixture was heated to reflux for 5 hours to form a complex of the metal alkoxide and the 2-nitrofuran. Each of the resulting solutions was applied onto a silicon substrate to a film thickness of 500 Å by spin coating. Each coating film was irradiated with 0.1 J/cm$^2$ of ultraviolet rays through a photomask, and then immersed in a 1:2 (volumetric ratio) mixed solvent of 2-methoxyethanol and isopropyl alcohol for 10 seconds for development. The results of patterning are evaluated in TABLE 88 as being satisfactory (o) or unsatisfactory (x).

TABLE 88

| Metal alkoxide | Amount of 2-nitrofuran added (molar ratio to alkoxide) | Result of patterning |
| --- | --- | --- |
| Lead diisopropoxide Pb (O-i-Pr)$_2$ | 0.5 | o |
|  | 1 | o |
|  | 2 | o |
| Zirconium tetra-n-butoxide Zr (O-n-Bu)$_4$ | 0.5 | o |
|  | 2 | o |
|  | 4 | o |
| Titanium tetra-isopropoxide Ti (O-i-Pr)$_4$ | 0.5 | o |
|  | 2 | o |
|  | 4 | o |
| Barium diisopropoxide Ba (O-i-Pr)$_2$ | 0.5 | o |
|  | 1 | o |
|  | 2 | o |
| Strontium diisopropoxide Sr (O-i-Pr)$_2$ | 0.5 | o |
|  | 1 | o |
|  | 2 | o |
| Bismuth tri-t-pentoxide Bi (O-t-Pe)$_3$ | 0.5 | o |
|  | 2 | o |
|  | 3 | o |
| Tantalum pentaethoxide Ta (OEt)$_5$ | 1 | o |
|  | 3 | o |
|  | 5 | o |
| Niobium pentaethoxide Nb (OEt)$_5$ | 1 | o |
|  | 3 | o |
|  | 5 | o |

EXAMPLE 89

In the same manner as in Example 88, except that anti-5-nitro-2-furaldoxime was used instead of the 2-nitrofuran, complexes were formed, applied, irradiated with light and developed, and the results of patterning are evaluated in TABLE 89 as being satisfactory (o) or unsatisfactory (x).

TABLE 89

| Metal alkoxide | Amount of anti-5-nitro-2-furaldoxime added (molar ratio to alkoxide) | Result of patterning |
| --- | --- | --- |
| Lead diisopropoxide Pb (O-i-Pr)$_2$ | 0.5 | o |
|  | 1 | o |
|  | 2 | o |
| Zirconium tetra-n-butoxide Zr (O-n-Bu)$_4$ | 0.5 | o |
|  | 2 | o |
|  | 4 | o |
| Titanium tetra-isopropoxide Ti (O-i-Pr)$_4$ | 0.5 | o |
|  | 2 | o |
|  | 4 | o |
| Barium diisopropoxide Ba (O-i-Pr)$_2$ | 0.5 | o |
|  | 1 | o |
|  | 2 | o |
| Strontium diisopropoxide Sr (O-i-Pr)$_2$ | 0.5 | o |
|  | 1 | o |
|  | 2 | o |
| Bismuth tri-t-pentoxide Bi (O-t-Pe)$_3$ | 0.5 | o |
|  | 2 | o |
|  | 3 | o |
| Tantalum pentaethoxide Ta (OEt)$_5$ | 1 | o |
|  | 3 | o |
|  | 5 | o |
| Niobium pentaethoxide Nb (OEt)$_5$ | 1 | o |
|  | 3 | o |
|  | 5 | o |

EXAMPLE 90

In the same manner as in Example 88, except that 5-nitro-2-furoic acid was used instead of the 2-nitrofuran, complexes were formed, applied, irradiated with light and developed, and the results of patterning are evaluated in TABLE 90 as being satisfactory (o) or unsatisfactory (x).

TABLE 90

| Metal alkoxide | Amount of 5-nitro-2-furoic acid added (molar ratio to alkoxide) | Result of patterning |
| --- | --- | --- |
| Lead diisopropoxide Pb (O-i-Pr)$_2$ | 0.5 | o |
|  | 1 | o |
|  | 2 | o |
| Zirconium tetra-n-butoxide Zr (O-n-Bu)$_4$ | 0.5 | o |
|  | 2 | o |
|  | 4 | o |
| Titanium tetra-isopropoxide Ti (O-i-Pr)$_4$ | 0.5 | o |
|  | 2 | o |
|  | 4 | o |
| Barium diisopropoxide Ba (O-i-Pr)$_2$ | 0.5 | o |
|  | 1 | o |
|  | 2 | o |
| Strontium diisopropoxide Sr (O-i-Pr)$_2$ | 0.5 | o |
|  | 1 | o |
|  | 2 | o |
| Bismuth tri-t-pentoxide Bi (O-t-Pe)$_3$ | 0.5 | o |
|  | 2 | o |
|  | 3 | o |
| Tantalum pentaethoxide Ta (OEt)$_5$ | 1 | o |
|  | 3 | o |
|  | 5 | o |
| Niobium pentaethoxide Nb (OEt)$_5$ | 1 | o |
|  | 3 | o |
|  | 5 | o |

EXAMPLE 91

In the same manner as in Example 88, except that 5-nitro-2-furaldehyde was used instead of the 2-nitrofuran, complexes were formed, applied, irradiated with light and developed, and the results of patterning are evaluated in TABLE 91 as being satisfactory (o) or unsatisfactory (x).

TABLE 91

| Metal alkoxide | Amount of 5-nitro-2-furaldehyde added (molar ratio to alkoxide) | Result of patterning |
|---|---|---|
| Lead diisopropoxide Pb (O-i-Pr)$_2$ | 0.5<br>1<br>2 | o<br>o<br>o |
| Zirconium tetra-n-butoxide Zr (O-n-Bu)$_4$ | 0.5<br>2<br>4 | o<br>o<br>o |
| Titanium tetra-isopropoxide Ti (O-i-Pr)$_4$ | 0.5<br>2<br>4 | o<br>o<br>o |
| Barium diisopropoxide Ba (O-i-Pr)$_2$ | 0.5<br>1<br>2 | o<br>o<br>o |
| Strontium diisopropoxide Sr (O-i-Pr)$_2$ | 0.5<br>1<br>2 | o<br>o<br>o |
| Bismuth tri-t-pentoxide Bi (O-t-Pe)$_3$ | 0.5<br>2<br>3 | o<br>o<br>o |
| Tantalum pentaethoxide Ta (OEt)$_5$ | 1<br>3<br>5 | o<br>o<br>o |
| Niobium pentaethoxide Nb (OEt)$_5$ | 1<br>3<br>5 | o<br>o<br>o |

TABLES 88 through 91 clearly show that formation of the complexes of the metal alkoxides and the nitrofuran derivatives allows patterning upon exposure to low-energy light even in cases where a small amount of each of the nitrofuran derivatives is added.

EXAMPLE 92

To form complexes, 2-nitrofuran in each of the proportions indicated in TABLE 92 was added to a composite alkoxide of Bi$_2$SrTa$_2$ formed by heating to reflux a mixture of 9.3 g of bismuth t-pentoxide, 8.71 g of tantalum ethoxide and 8.03 g of a 9.95% by weight solution of strontium in 2-methoxyethanol, and 2.3 g of 2-ethylbutyric acid was added to each of the complexes to prevent the highly hydrolyric action of the remaining functional groups of the composite alkoxide thereby stabilizing the solution, and finally the weight of the mixture was adjusted by addition of 2-methoxyethanol thereto to prepare 100 g of a 10% by weight Bi$_2$SrTa$_2$O$_9$ composition for formation of thin-film patterns.

Each of the resulting compositions was applied onto a silicon substrate to a film thickness of 800 Å by spin coating, and thereafter the coating film was irradiated with ultraviolet rays having the amount of energy indicated in TABLE 92 through a photomask and was then immersed in isopropyl alcohol used as the solvent for 10 seconds for development. The results of patterning are evaluated in TABLE 92 as being satisfactory (o) or unsatisfactory (x).

TABLE 92

| Amount of 2-nitrofuran added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

EXAMPLE 93

In the same manner as in Example 92, except that anti-5-nitro-2-furaldoxime was used in each of the proportions indicated in TABLE 93 instead of the 2-nitrostyrol, a 10% by weight Bi$_2$SrTa$_2$O$_9$ composition for formation of thin-film patterns was prepared, exposed to light and developed, and the results of patterning are evaluated in TABLE 93 as being satisfactory (o) or unsatisfactory (x).

TABLE 93

| Amount of anti-5-nitro-2-furaldoxime added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

EXAMPLE 94

To form complexes, 2-nitrofuran in each of the proportions indicated in TABLE 94 was added to 100 g of a 15% by weight solution of a composite alkoxide of SrTa$_2$ formed by heating to reflux a mixture of 27.1 g of tantalum ethoxide and 29.4 g of a 9.95% by weight solution of strontium in 2-methoxyethanol and dissolving the mixture in 2-methoxyethanol, and 7.8 g of 2-ethylbutyric acid was added to each of the complexes to prevent the highly hydrolytic action of the remaining functional groups of the composite alkoxide thereby stabilizing the solution, and after addition of a 9.63% by weight solution of bismuth 2-ethylhexanoate in isoamyl acetate to the solution, the solution was finally adjusted by addition of 2-methoxyethanol thereto to prepare a 10% by weight Bi$_2$SrTa$_2$O$_9$ composition for formation of thin-film patterns.

The resulting compositions were exposed to light and developed in the same manner as in Example 92, with the results shown in TABLE 94 wherein the patterning is evaluated to be satisfactory (o) or unsatisfactory (x).

TABLE 94

| Amount of 2-nitrofuran added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |

TABLE 94-continued

| Amount of 2-nitrofuran added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0.1 | o | o | o | o | o | o |
| 1 | o | o | o | o | o | o |
| 2 | o | o | o | o | o | o |
| 4 | o | o | o | o | o | o |

EXAMPLE 95

In the same manner as in Example 94, except that anti-5-nitro-2-furaldoxime in each of the proportions indicated in TABLE 95 was added instead of the 2-nitrofuran, a 10% by weight Bi$_2$SrTa$_2$O$_9$ composition for formation of thin-film patterns was prepared, exposed to light and developed, and the results of patterning are evaluated in TABLE 95 as being satisfactory (o) or unsatisfactory (x).

TABLE 95

| Amount of anti-5-nitro-2-furaldoxime added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

EXAMPLE 96

In the same manner as in Example 94, except that the bismuth material was replaced by a solution of bismuth nitrate in 2-methoxyethanol, a 10% by weight Bi$_2$SrTa$_2$O$_9$ composition for formation of thin-film patterns was prepared, exposed to light and developed, and the results of patterning are evaluated in TABLE 96 as being satisfactory (o) or unsatisfactory (x).

TABLE 96

| Amount of 2-nitrofuran added (molar ratio to alkoxide) | Amount of light radiation energy (J/cm$^2$) | | | | | |
|---|---|---|---|---|---|---|
| | 0.5 | 1 | 3 | 5 | 8 | 10 |
| 0 | x | x | x | x | x | o |
| 0.02 | x | x | o | o | o | o |
| 0.05 | x | o | o | o | o | o |
| 0.1 | o | o | o | o | o | o |
| 1 | o | o | o | o | o | o |
| 2 | o | o | o | o | o | o |
| 4 | o | o | o | o | o | o |

TABLES 88 through 96 clearly show that the formation of the composite alkoxides of the metal alkoxides and the subsequent formation of the complexes thereof by addition of the nitro compounds thereto produce better results.

As explained in detail above, according to the present invention which relates to a composition for formation of thin-film patterns of a metal oxide, a process for preparation thereof and a process for formation of thin-film patterns of a metal oxide, more efficient patterning can be performed without causing inferior characteristics of the formed thin-film patterns of a metal oxide, with lower-energy radiation and thus with reduced patterning times and patterning costs, based on the sol-gel method which allows efficient patterning at low cost by a smaller number of preparation steps. As a result, the process for preparation of electronic parts and optics which utilizes those processes allows easy, efficient and economical preparation of electronic parts and optics with excellent characteristics.

EXAMPLE 97

A 11.65-g portion of lead acetate trihydrate was added to 75 g of 2-methoxyethanol, and the resulting mixture was heated to dissolution for dehydration as an azeotropic mixture thereby providing a solution of anhydrous lead acetate. To this solution there were added 6.12 g of zirconium tetra-n-butoxide, 4.19 g of titanium tetra-isopropoxide and 2-methoxyethanol in an amount required to adjust the total weight of the mixture to 100 g thereby providing a 10% by weight PbZr$_{0.52}$Ti$_{0.48}$O$_3$ (PZT) composition for formation of thin films. A 4.7 g-portion of 2-nitrobenzyl alcohol was added to the composition to provide a composition for formation of photosensitive PZT thin-film patterns. This composition was then diluted to ten-fold with 2-methoxyethanol to prepare a solution for LSMCVD.

As shown in FIG. 1, a substrate for forming a film thereon was prepared by laying 1 μm-spaced, 1 μm-thick SiO$_2$ films 2, 2 on a Si wafer 1 to form a step.

The substrate was placed in a vacuum chamber, heated to 70° C. with a heater and maintained at a degree of vacuum of 500 Torr.

Figure 2:
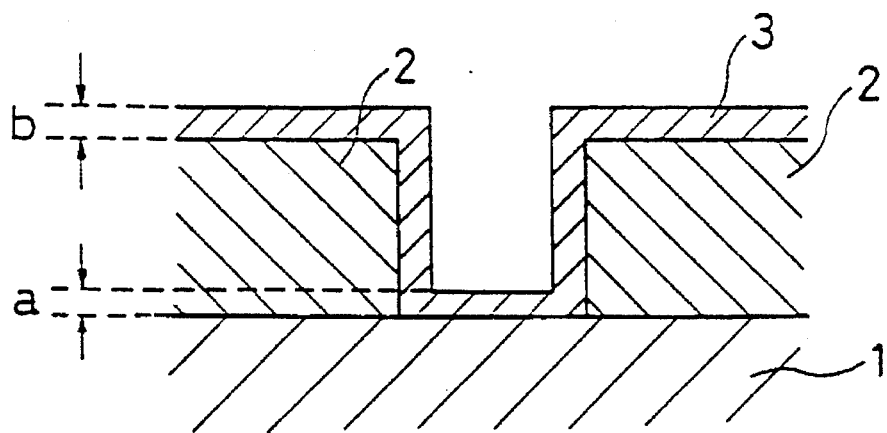
FIG. 2 is a sectional view illustrative of the coated state of the thin films of Examples 97–110 and Comparative examples 1–4.

The above solution for LSMCVD was then misted with an ultrasonic mist generator, and the resulting mist was introduced, using Ar as the carrier gas, onto the surface of the substrate in the vacuum chamber to deposit and accumulate the mist thereon. During this process, the degree of vacuum was maintained at 500 Torr, and as shown in FIG. 2, a PZT film 3 was formed on the substrate 1 which had the various film thicknesses indicated in TABLE 97 while irradiating the surface of the substrate with light with a center wavelength at 254 nm from a ultraviolet light lamp (energy: 3 mW/cm$^2$). After completion of the formation of the film, the resulting film was observed with an SEM to measure the thickness "a" of the section of the thin film 3 on the exposed surface of the Si wafer between the SiO$_2$ films 2, 2 and the thickness "b" of the section of the thin film 3 on the SiO$_2$ films 2, 2 and to determine the ratio of the film thicknesses "a" to "b" (a/b), with the results shown in TABLE 97. Here, the closer to 1 the ratio a/b is, the better the step coverage.

EXAMPLE 98

In the same manner as in Example 97, except that 4.7 g of 2-nitrobenzaldehyde was added instead of the 4.7 g of 2-nitrobenzyl alcohol, there was prepared a solution for LSMCVD. Films were formed using light with a center wavelength at 365 nm from a ultraviolet light lamp (energy: 4 mW/cm$^2$) and otherwise following the procedures in Example 97, and ratios of the film thicknesses "a" to "b" (a/b) were determined, with the results shown in TABLE 97.

EXAMPLES 99–105

In the same manner as in Example 97, except that 4.7 g of each of the photoreactive compounds indicated in TABLE 97 was added instead of the 4.7 g of 2-nitrobenzyl alcohol, there were prepared solutions for LSMCVD which were then subjected to formation of films, and ratios of the film thicknesses "a" to "b" (a/b) were determined, with the results shown in TABLE 97.

COMPARATIVE EXAMPLE 1

In the same manner as in Example 97, except that no 2-nitrobenzyl alcohol was added, there were prepared solutions for LSMCVD which were then subjected to formation of films, and ratios of the film thicknesses "a" to "b" (a/b) were determined, with the results shown in TABLE 97.

4 mW/cm$^2$) and otherwise following the procedures in Example 97, and ratios of the film thicknesses "a" to "b" (a/b) were determined, with the results shown in TABLE 98.

COMPARATIVE EXAMPLE 2

In the same manner as in Example 106, except that no 2-nitrobenzyl alcohol was added, there were prepared solutions for LSMCVD which were then subjected to formation of films, and ratios of the film thicknesses "a" to "b" (a/b) were determined, with the results shown in TABLE 98.

TABLE 97

FORMATION OF PZT THIN FILMS

| Film | Photoreactive compound | Film thickness (Å) | | | | | | | | |
|---|---|---|---|---|---|---|---|---|---|---|
| | | 1000 | 1300 | 1600 | 1900 | 2200 | 2500 | 2800 | 3100 | 3400 |
| Example 97 | 2-Nitrobenzyl alcohol | 1.01 | 1.01 | 1.02 | 1.03 | 1.04 | 1.05 | 1.06 | 1.07 | 1.08 |
| Example 98 | 2-Nitrobenzaldehyde | 1.01 | 1.01 | 1.02 | 1.02 | 1.03 | 1.04 | 1.06 | 1.06 | 1.07 |
| Example 99 | β-Nitrostyrol | 1.01 | 1.02 | 1.02 | 1.03 | 1.04 | 1.06 | 1.06 | 1.07 | 1.08 |
| Example 100 | o-Nitroacetophenone | 1.01 | 1.01 | 1.03 | 1.03 | 1.04 | 1.05 | 1.06 | 1.08 | 1.09 |
| Example 101 | o-Nitroanisole | 1.01 | 1.03 | 1.03 | 1.04 | 1.04 | 1.05 | 1.06 | 1.07 | 1.08 |
| Example 102 | 2-Nitrofuran | 1.01 | 1.01 | 1.02 | 1.03 | 1.04 | 1.04 | 1.05 | 1.07 | 1.07 |
| Example 103 | Anti-5-nitrofuraldoxime | 1.01 | 1.02 | 1.03 | 1.03 | 1.04 | 1.05 | 1.06 | 1.07 | 1.09 |
| Example 104 | 5-Nitro-2-furoic acid | 1.01 | 1.02 | 1.03 | 1.05 | 1.07 | 1.07 | 1.08 | 1.09 | 1.10 |
| Example 105 | 5-Nitro-2-furaldehyde | 1.01 | 1.02 | 1.03 | 1.04 | 1.05 | 1.06 | 1.07 | 1.08 | 1.09 |
| Comparative example 1 | — | 1.01 | 1.02 | 1.03 | 1.05 | 1.07 | 1.08 | 1.10 | 1.13 | 1.17 |

EXAMPLE 106

A 32.9-g portion of a 5% by weight barium solution prepared with barium octylate and isoamyl acetate, 21.0 g of a 5% by weight strontium solution prepared with strontium octylate and isoamyl acetate and 6.8 g of titanium tetraisopropoxide were mixed, and the total weight of the resulting mixture was increased to 100 g by addition of isoamyl acetate thereto to prepare a 5% by weight solution of $Ba_{0.5}Sr_{0.5}TiO_3$ (BST). To this solution there was added 7.4 g of 2-nitrobenzyl alcohol to provide a photosensitive composition for formation of BST thin-film patterns. This composition was then diluted to ten-fold with isoamyl acetate to prepare a solution for LSMCVD which was then used in the same manner as in Example 97 to form films and to determine the ratio of the film thicknesses "a" to "b" (a/b), with the results shown in TABLE 98.

EXAMPLE 107

In the same manner as in Example 106, except that 7.4 g of 2-nitrobenzaldehyde was added instead of the 7.4 g of 2-nitrobenzyl alcohol, there was prepared a solution for LSMCVD. Films were formed using light with a center wavelength at 365 nm from a ultraviolet light lamp (energy:

TABLE 98

FORMATION OF BST THIN FILMS

| Film | Photoreactive compound | Film thickness (Å) | | | | | | | | |
|---|---|---|---|---|---|---|---|---|---|---|
| | | 1000 | 1300 | 1600 | 1900 | 2200 | 2500 | 2800 | 3100 | 3400 |
| Example 106 | 2-Nitrobenzyl alcohol | 1.02 | 1.02 | 1.03 | 1.03 | 1.05 | 1.07 | 1.07 | 1.08 | 1.08 |
| Example 107 | 2-Nitrobenzaldehyde | 1.01 | 1.01 | 1.01 | 1.02 | 1.02 | 1.03 | 1.05 | 1.06 | 1.06 |
| Comparative example 2 | — | 1.02 | 1.03 | 1.04 | 1.07 | 1.08 | 1.10 | 1.11 | 1.15 | 1.18 |

EXAMPLE 108

A 8.68-g portion of a 5% by weight strontium solution prepared with strontium octylate and isoamyl acetate, 41.2 g of a 5% by weight bismuth solution prepared with bismuth octylate and isoamyl acetate and 4.0 g of tantalum pentaethoxide were mixed, and the total weight of the resulting mixture was increased to 100 g by addition of a 1:1 (weight ratio) mixed solvent of isoamyl acetate and 2-methoxyethanol thereto to prepare a 5% by weight solution of $SrBi_2Ta_2O_9$ (SBT). To this solution there was added 3.0 g of 2-nitrobenzyl alcohol to provide a photosensitive composition for formation of SBT thin-film patterns. This composition was then diluted to ten-fold with a 1:1 (weight ratio) mixed solvent of isoamyl acetate and 2-methoxyethanol to prepare a solution for LSMCVD which was then used in the same manner as in Example 97 to form films and to determine the ratio of the film thicknesses "a" to "b" (a/b), with the results shown in TABLE 99.

EXAMPLE 109

In the same manner as in Example 108, except that 3.0 g of 2-nitrobenzaldehyde was added instead of the 3.0 g of 2-nitrobenzyl alcohol, there was prepared a solution for LSMCVD. Films were formed using light with a center wavelength at 365 nm from a ultraviolet light lamp (energy: 4 mW/cm$^2$) and otherwise following the procedures in Example 97, and ratios of the film thicknesses "a" to "b" (a/b) were determined, with the results shown in TABLE 99.

COMPARATIVE EXAMPLE 3

In the same manner as in Example 108, except that no 2-nitrobenzyl alcohol was added, there were prepared solutions for LSMCVD which were then subjected to formation of films, and ratios of the film thicknesses "a" to "b" (a/b) were determined, with the results shown in TABLE 99.

COMPARATIVE EXAMPLE 4

In the same manner as in Example 110, except that no 2-nitrobenzyl alcohol was added, there were prepared solutions for LSMCVD which were then subjected to formation of films, and ratios of the film thicknesses "a" to "b" (a/b) were determined, with the results shown in TABLE 100.

TABLE 99

FORMATION OF SBT THIN FILMS

| Film | Photoreactive compound | Film thickness (Å) | | | | | | | | |
| --- | --- | --- | --- | --- | --- | --- | --- | --- | --- | --- |
| | | 1000 | 1300 | 1600 | 1900 | 2200 | 2500 | 2800 | 3100 | 3400 |
| Example 108 | 2-Nitrobenzyl alcohol | 1.01 | 1.02 | 1.02 | 1.03 | 1.03 | 1.05 | 1.06 | 1.06 | 1.07 |
| Example 109 | 2-Nitrobenzaldehyde | 1.01 | 1.01 | 1.02 | 1.02 | 1.03 | 1.03 | 1.05 | 1.05 | 1.06 |
| Comparative example 3 | — | 1.03 | 1.04 | 1.06 | 1.07 | 1.09 | 1.11 | 1.15 | 1.19 | 1.22 |

EXAMPLE 110

A 1.8-g portion of lithium ethoxide, 10.8 g of niobium pentaethoxide and 87.4 g of 2-methoxyethanol were mixed to prepare a 5% by weight solution of LiNbO$_3$ (LN). To this solution there was added 5.3 g of 2-nitrobenzyl alcohol to provide a photosensitive composition for formation of LN thin-film patterns. This composition was then diluted to ten-fold with 2-methoxyethanol to prepare a solution for LSMCVD which was then used in the same manner as in Example 97 to form films and to determine the ratio of the film thicknesses "a" to "b" (a/b), with the results shown in TABLE 100.

TABLE 100

FORMATION OF LN THIN FILMS

| Film | Photoreactive compound | Film thickness (Å) | | | | | | | | |
| --- | --- | --- | --- | --- | --- | --- | --- | --- | --- | --- |
| | | 1000 | 1300 | 1600 | 1900 | 2200 | 2500 | 2800 | 3100 | 3400 |
| Example 110 | 2-Nitrobenzyl alcohol | 1.01 | 1.02 | 1.02 | 1.03 | 1.03 | 1.04 | 1.06 | 1.06 | 1.07 |
| Comparative example 4 | — | 1.03 | 1.04 | 1.05 | 1.07 | 1.09 | 1.12 | 1.14 | 1.17 | 1.19 |

As TABLES 97 through 100 clearly show, formation of thin films by incorporation of a photoreactive compound and irradiation with light according to the present invention results in formation of thin films with even film thicknesses and excellent step coverage even in cases where the thin films have relatively large thicknesses.

As explained in detail above, the process for formation of thin films according to the present invention allows easy and efficient formation of thin films with even film thicknesses and excellent step coverage which precisely traces the configuration of each substrate even in cases where it is intended to form thin films with relatively large thicknesses on stepped substrates.

What is claimed is:

1. A composition for formation of thin-film patterns of metal oxide by irradiation with light, comprising:
   one or more metal alkoxides; and
   one of more nitro compounds selected from the group consisting of nitrobenzyl alcohols, nitrobenzaldehydes, nitrostyrols, nitroacetophenones, nitroanisoles, nitrofurans, and photoreactive derivatives thereof.

2. A composition for formation of thin-film patterns of metal oxide as claimed in claim 1, wherein the nitro compound(s) are present in a proportion of 0.05 to 6 mole per mole of the metal alkoxide(s).

3. A composition for formation of thin-film patterns of metal oxide as claimed in claim 2, wherein the nitro compound(s) are present in a proportion of 0.3 to 2 mole per mole of the metal alkoxide(s).

4. A composition for formation of thin-film patterns of metal oxide as claimed in claim 1, wherein the nitrobenzyl alcohol used is 2-nitrobenzyl alcohol.

5. A composition for formation of thin-film patterns of metal oxide as claimed in claim 1, wherein the nitrobenzaldehyde used is 2-nitrobenzaldehyde.

6. A composition for formation of thin-film patterns of metal oxide as claimed in claim 1, wherein the nitrobenzaldehyde derivative used is 2,4-dinitrobenzaldehyde.

7. A composition for formation of thin-film patterns of metal oxide as claimed in claim 1, wherein the nitrostyrol used is $\beta$-nitrostyrol.

8. A composition for formation of thin-film patterns of metal oxide as claimed in claim 1, wherein the nitroacetophenone used is o-nitroacetophenone.

9. A composition for formation of thin-film patterns of metal oxide as claimed in claim 1, wherein the nitroanisole used is o-nitroanisole.

10. A composition for formation of thin-film patterns of metal oxide as claimed in claim 1, wherein the nitrofuran used is 2-nitrofuran.

11. A composition for formation of thin-film patterns of metal oxide as claimed in claim 1, wherein the nitrofuran derivative used is anti-5-nitro-2-furaldoxime.

12. A composition for formation of thin-film patterns of metal oxide as claimed in claim 1, wherein the nitrofuran derivative used is 5-nitro-2-furoic acid.

13. A composition for formation of thin-film patterns of metal oxide as claimed in claim 1, wherein the nitrofuran derivative used is 5-nitro-2-furaldehyde.

14. A composition for formation of thin-film patterns of metal oxide as claimed in claim 1, which further contains a stabilizer for the metal alkoxide(s) which does not strongly absorb light in the same wavelength range as the irradiated light.

15. A composition for formation of thin-film patterns of metal oxide as claimed in claim 14, wherein the stabilizer comprises one of more compounds selected from the group consisting of ethanolamines, $\beta$-diketones, $\beta$-ketoesters, carboxylic acids, glycols and glycol esters.

16. A process for preparation of a composition for formation of thin-film patterns of metal oxide as claimed in claim 14, comprising;
   preforming a complex of the metal alkoxide(s) and the nitro compound(s) by heating to reflux the metal alkoxide(s) and the nitro compound(s) in a solvent, and then adding the stabilizer to the composition.

17. A composition for formation of thin-film patterns of metal oxide as claimed in claim 1, which contains a complex of the metal alkoxide(s) and the nitro compound(s) formed by heating to reflux a solution of the metal alkoxide(s) and the nitro compound(s) in a solvent.

18. A composition for formation of thin-film patterns of metal oxide as claimed in claim 1, which contains two or more metal alkoxides.

19. A composition for formation of thin-film patterns of metal oxide as claimed in claim 18, wherein the two or more metal alkoxides are contained as a composite alkoxide.

20. A process for preparation of a composition for formation of thin-film patterns of metal oxide as claimed in claim 19, which composition further contains another component, comprising:
   preforming a composite alkoxide by heating to reflux the two or more metal alkoxides in a solvent, and then adding the other component to the composition.

21. A process for preparation of a composition for formation of thin-film patterns of metal oxide as claimed in claim 19, which composition further contains a stabilizer for the metal alkoxide, comprising:
   preforming a composition alkoxide by heating to reflux the two or more metal alkoxides in a solvent, and then adding the nitro compound(s) to the composition which is then heated to reflux to form a complex of the composite alkoxide and the nitro compound(s), and thereafter adding the stabilizer to the composition.

22. A process for preparation of a composition for formation of thin-film patterns of metal oxide as claimed in claim 1, comprising:
   preforming a complex of the metal alkoxide(s) and the nitro compound(s) by heating to reflux the metal alkoxide(s) and the nitro compound(s) in a solvent, and then adding another component to the composition.

* * * * *